US008766440B2

(12) United States Patent
Kikuchi et al.

(10) Patent No.: US 8,766,440 B2
(45) Date of Patent: Jul. 1, 2014

(54) WIRING BOARD WITH BUILT-IN SEMICONDUCTOR ELEMENT

(75) Inventors: Katsumi Kikuchi, Tokyo (JP); Shintaro Yamamichi, Tokyo (JP); Hideya Murai, Tokyo (JP); Kentaro Mori, Tokyo (JP); Yoshiki Nakashima, Tokyo (JP); Daisuke Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/582,128

(22) PCT Filed: Jan. 25, 2011

(86) PCT No.: PCT/JP2011/051298
§ 371 (c)(1),
(2), (4) Date: Aug. 31, 2012

(87) PCT Pub. No.: WO2011/108308
PCT Pub. Date: Sep. 9, 2011

(65) Prior Publication Data
US 2012/0319254 A1 Dec. 20, 2012

(30) Foreign Application Priority Data
Mar. 4, 2010 (JP) ................... 2010-047857

(51) Int. Cl.
*H01L 23/52* (2006.01)
(52) U.S. Cl.
USPC ............................ 257/738; 257/700; 257/659
(58) Field of Classification Search
CPC ............ H01L 2224/82; H01L 2224/97; H01L 2224/2919; H01L 2924/15311; H01L 2924/0665
USPC .................. 257/659, 773, E23.151, E23.153, 257/E23.062, E23.069, E23.178
See application file for complete search history.

(56) References Cited

U.S. PATENT DOCUMENTS

| 2004/0224497 A1* | 11/2004 | Barth ............................ 438/637 |
| 2005/0161823 A1* | 7/2005 | Jobetto et al. ................. 257/758 |
| 2006/0012029 A1* | 1/2006 | Kikuchi et al. ............... 257/700 |
| 2009/0072404 A1 | 3/2009 | Kikuchi et al. |

(Continued)

FOREIGN PATENT DOCUMENTS

| JP | 2001015650 A | 1/2001 |
| JP | 2001339165 A | 12/2001 |

(Continued)

OTHER PUBLICATIONS

The international search report for PCT/JP2011/051298 dated Feb. 22, 2011.

*Primary Examiner* — Yu-Hsi D Sun
*Assistant Examiner* — Christina Sylvia
(74) *Attorney, Agent, or Firm* — Sughrue Mion, PLLC

(57) ABSTRACT

A wiring board including a built-in semiconductor element includes the semiconductor element, a peripheral insulating layer covering an outer peripheral side surface of the semiconductor element, an upper surface-side wiring provided on an upper surface side of the wiring board, and a lower surface-side wiring provided on a lower surface side of the wiring board. The semiconductor element includes a first wiring structure layer including a first wiring and a first insulating layer alternately provided on a semiconductor substrate, and a second wiring structure layer including a second wiring and a second insulating layer alternately provided on the first wiring structure layer. The upper surface-side wiring includes a wiring electrically connected to the first wiring via the second wiring. The second wiring is thicker than the first wiring and thinner than the upper surface-side wiring. The second insulating layer is formed of a resin material and is thicker than the first insulating layer.

29 Claims, 6 Drawing Sheets

(56) References Cited

U.S. PATENT DOCUMENTS

2010/0103634 A1   4/2010   Funaya et al.

FOREIGN PATENT DOCUMENTS

| | | |
|---|---|---|
| JP | 2004095836 A | 3/2004 |
| JP | 2006032600 A | 2/2006 |
| JP | 2007150154 A | 6/2007 |
| JP | 2008182039 A | 8/2008 |
| JP | 2008270362 A | 11/2008 |
| JP | 2008270443 A | 11/2008 |
| JP | 2009071045 A | 4/2009 |
| WO | 2008120755 A | 10/2008 |
| WO | 2010010910 A1 | 1/2010 |

* cited by examiner (a)

(b)

(c)

(a)

(b)

(c)

(d)

WIRING BOARD WITH BUILT-IN SEMICONDUCTOR ELEMENT

TECHNICAL FIELD

The present invention relates to a wiring board with a built-in semiconductor element.

BACKGROUND ART

In connection with an increasing reduction in the weight, thickness, and size of electronic equipment, every effort has been made to reduce the sizes of semiconductor elements, to increase the degree of integration, and to improve high-density packaging techniques for semiconductor packages.

For packaging of semiconductor elements such as IC chips, interconnection of a wiring board and a semiconductor element in a package is carried out by wire bonding using gold wires or the like or flip chip interconnection using solder balls or the like.

The wire bonding has the advantage of allowing packaging to be inexpensively achieved if the semiconductor element involves a small number of connection pads. However, wire diameter needs to be reduced with increasing number and decreasing pitch of connection pads. This may disadvantageously lead to inappropriate assembly such as wire breakage and thus reduced manufacturing yield. Furthermore, with the wire bonding, the connection paths between terminals of the semiconductor element and terminals of the wiring board need to have a certain length. This may disadvantageously degrade high-speed transmission characteristics.

The flip chip interconnection enables high-speed signal transmission due to the use of a connection path shorter than in the case of the wire bonding, between the semiconductor element and the wiring board. Furthermore, the flip chip interconnection allows terminals to be provided not only around but also all over a circuit surface of the semiconductor element, enabling an increase in the number of connection terminals. However, the increased number and reduced pitch of connection pads on the semiconductor element reduces the size of solder bumps, disadvantageously leading to reduced connection strength and the increased likelihood of inappropriate connections such as cracks.

In recent years, as a high-density packaging technique for facilitating a further increase in the density of semiconductor elements and further improvement of functions of the semiconductor elements, a packaging technique for building a semiconductor element in a wiring substrate, what is called, a semiconductor element build-in technique, has been proposed. This technique has the advantages of, for example, reducing the thickness and cost of the package, allowing high frequencies to be dealt with, enabling connections to be established with reduced stress, and improving electromigration characteristics.

For example, Patent Literature 1 discloses a ball grid array package including an IC chip fixed on a metal heat sink and buried in an insulating layer, wiring conductors connected directly to packaging pads of the IC chip, externally formed BGA packaging pads electrically connected to the wiring conductors, and BGA solder bumps joined to the BGA packaging pads.

Patent Literature 2 discloses a semiconductor device including a semiconductor chip size package (CSP) with a semiconductor chip, rewiring on the semiconductor chip, a sealing film that covers the rewiring, and columnar electrodes on the rewiring; a frame-like burying material provided on sides of the semiconductor chip size package, a sealing film provided between the semiconductor chip size package and the frame-like burying material, an insulating film covering the semiconductor chip size package, and upper layer-side rewiring provided on the insulating film and connected to the columnar electrodes, wherein the semiconductor chip size package and the frame-like burying material are provided on a base plate.

On the other hand, Patent Literature 3 discloses, as a semiconductor chip for mounting on a packaging board, a semiconductor device including a micro wiring structure portion in which a first wiring layer and a first insulating layer are alternately stacked on a semiconductor substrate, a first macro wiring structure portion in which a second wiring layer and a second insulating layer are alternately stacked on the micro wiring structure portion, and a second macro-wiring structure portion in which a third wiring layer and the second insulating layer are alternately stacked on the first macro wiring structure portion, wherein each of the second and third insulating layers is thicker than the first insulating layer, a modulus of elasticity of the third insulating layer at 25° C. is equal to or lower than a modulus of elasticity of the second insulating layer at 25° C., and each of the second and third wiring layers is at least twice as thick as the first wiring layer. Patent Literature 3 discloses that such a semiconductor device can reduce stress generated after the semiconductor device is mounted on a packaging board.

CITATION LIST

Patent Literature

Patent Literature 1: JP2001-15650A
Patent Literature 2: JP2004-95836A
Patent Literature 3: JP2006-32600A

SUMMARY OF INVENTION

Technical Problem

However, the above-described semiconductor element build-in techniques have the following problems.

According to the technique described in Patent Literature 1, conductive wiring lines connected to an IC chip fixed on a metal heat sink are formed directly (or via conductive portions filled in openings of an insulating layer) on pads of the IC chip by a plating method. Thereafter, a multilayer structure is built up in a normal manner. In such a structure, the wiring structure on the IC chip is significantly different from the micro wiring structure in the IC chip in design rules for pitch and the like. Thus, leading sufficient signal lines out from the IC chip is difficult. A plurality of wiring layers may be provided in the IC chip so as to make the pitch suitable for the upper multilayer wiring structure. However, this increases the number of wiring layers stacked in the IC chip and thus the manufacturing cost of the IC chip.

The technique described in Patent Literature 2 provides rewiring lines connected to pads of a semiconductor chip, enabling an increase in arrangement intervals between external terminals. However, the wiring layers are stacked at a consistently similar pitch and a consistently similar thickness from the lowermost rewiring layer connected to the semiconductor chip to the uppermost rewiring layer connected to the external terminals. Such a multilayer wiring structure is greatly different from the micro wiring structure in the semiconductor chip in design rules. Thus, following the rules for wiring boards for packaging precludes wiring pitches and the like of the wiring boards from being compatible with pitches of connection portions and the like of the semiconductor chip. This makes leading sufficient signal lines out from the semiconductor chip difficult. On the other hand, following the rules for the semiconductor chip allows the wiring pitches to be easily made compatible but increases wiring resistance, not only precluding desired electrical characteristics from being obtained but also posing other problems such as wiring breakage caused by stress. Moreover, this multilayer wiring structure includes thick layers, and thus multilayering for rewiring makes a reduction in the thickness of the device as a whole difficult.

Furthermore, in a wiring substrate with a built-in semiconductor element such as a semiconductor chip, the component material of the semiconductor element is significantly different, in the coefficient of thermal expansion, from a resin material forming the wiring substrate. Thus, high stress is applied to electric connection portions between the semiconductor element and the wiring substrate, and the connection portions are disadvantageously likely to be broken. This problem is more serious if the built-in semiconductor element includes a low dielectric constant film (Low-k film) with inferior mechanical characteristics and a low relative dielectric constant of at most 3.

An object of the present invention is to provide a thin and reliable wiring board with a built-in high-density semiconductor element.

Solution to Problem

An aspect of the present invention provides a wiring board including a built-in semiconductor element, the wiring board including:
a semiconductor element;
a peripheral insulating layer covering at least an outer peripheral side surface of the semiconductor element;
an upper surface-side wiring provided on an upper surface side of the wiring board; and
a lower surface-side wiring provided on a lower surface side of the wiring board,
wherein the semiconductor element includes:
a semiconductor substrate;
a first wiring structure layer including a first wiring and a first insulating layer alternately provided on the semiconductor substrate; and
a second wiring structure layer including a second wiring and a second insulating layer alternately provided on the first wiring structure layer,
the upper surface-side wiring includes a wiring electrically connected to the first wiring via the second wiring,
the second wiring is thicker than the first wiring and thinner than the upper surface-side wiring, and
the second insulating layer is formed of a resin material and is thicker than the first insulating layer.

Advantageous Effect of Invention

The present invention can provide a thin and reliable wiring board with a built-in high-density semiconductor element.

DESCRIPTION OF EMBODIMENTS

Figure 1:
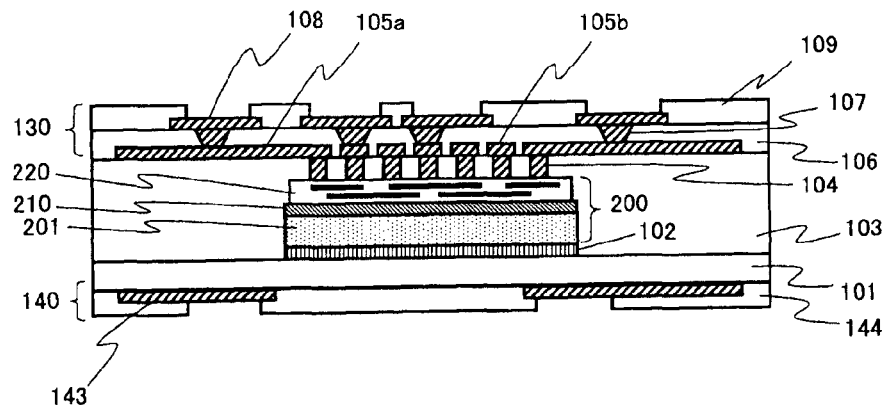
FIG. 1 is a cross-sectional view showing a wiring board according to a first exemplary embodiment of the present invention.

Exemplary embodiments of the present invention will be described below.

A wiring board with a built-in semiconductor element according to an exemplary embodiment includes a semiconductor element, a peripheral insulating layer covering at least an outer peripheral side surface of the semiconductor element, upper surface-side wiring provided on an upper surface side of the wiring board, and lower surface-side wiring provided on a lower surface side of the wiring board. The semiconductor element built in the wiring board includes a semiconductor substrate, a first wiring structure layer including a first wiring and a first insulating layer alternately provided on the semiconductor substrate, and a second wiring structure layer including a second wiring and a second insulating layer alternately provided on the first wiring structure layer. The upper surface-side wiring includes a wiring electrically connected to the first wiring via the second wiring.

The second wiring is thicker than the first wiring and thinner than the upper surface-side wiring.

The second insulating layer is formed of a resin material and is thicker than the first insulating layer. The second insulating layer is formed of a material different from a material of the first insulating layer. Preferably, the first insulating layer uses a material for which electrical characteristics and high processing accuracy are given top priority, whereas a high toughness resin material for which reliability is given top priority is used for the second insulating layer. Thus, even with the reduced thickness of the semiconductor element, shock resistance can be improved. Furthermore, a stress relaxation effect can be exerted by the second wiring structure layer including the second insulating layer formed of such a resin material as described above. The second wiring structure layer preferably includes, as the second insulating layer, an insulating layer with a modulus of elasticity smaller than the modulus of elasticity of the first insulating layer. Additionally, the second insulating layer preferably includes no filler.

The wiring board according to the exemplary embodiment includes a base insulating layer on an upper surface side of which the semiconductor element can be provided.

The upper surface-side wiring of the wiring board according to the exemplary embodiment may include a fanout wiring led out from a position immediately above the built-in semiconductor element to a peripheral area (an upper surface of the peripheral insulating layer) lying outside an outer edge of the semiconductor element. The fanout wiring may be electrically connected to the first wiring via the second wiring.

The wiring board according to the exemplary embodiment includes lateral-to-element vias electrically connected to the fanout wiring in the peripheral insulating layer. The lower surface-side wiring may be electrically connected to the fanout wiring via the lateral-to-element vias.

The first wiring structure layer may include an insulating layer formed of an inorganic insulating material, as the first insulating layer in view of the processing accuracy for the inorganic insulating material and the like. Furthermore, the first wiring structure layer may include an insulating layer formed of a low dielectric constant material, as the first insulating layer in view of electrical characteristics. The first wiring structure layer may include an insulating layer formed of an inorganic insulating material and an insulating layer formed of a low dielectric constant material. The first wiring structure layer may include an insulating layer formed of an organic insulating layer.

Preferably, the second wiring is formed based on a design rule different from a design rule for the first wiring, a design rule for the upper surface-side wiring, and a design rule for the lower surface-side wiring. A minimum wiring width and a minimum wiring interval for the second wiring are respectively larger than the minimum wiring width and the minimum wiring interval for the first wiring, and smaller than the minimum wiring widths and the minimum wiring intervals for the upper and lower surface-side wirings.

The second wiring is thicker than the first wiring, and the second insulating layer is thicker than the first insulating layer. The second wiring is preferably at least twice and more preferably at least three times as thick as the first wiring. The second insulating layer is preferably at least twice and more preferably at least three times as thick as the first insulating layer. Furthermore, more preferably, the second wiring is at least twice as thick as the first wiring, and the second insulating layer is at least twice as thick as the first insulating layer. Moreover, more preferably, the second wiring is at least three times as thick as the first wiring, and the second insulating layer is at least three times as thick as the first insulating layer.

The entire lower surface of the second wiring structure layer is provided on the upper surface of the first wiring structure layer. An outer peripheral side surface of the second wiring structure layer may form an outer peripheral side surface of the semiconductor element, together with an outer peripheral side surface of the first wiring structure layer and an outer peripheral side surface of the semiconductor substrate. Furthermore, the outer peripheral side surface of the second wiring structure layer may be located inside the outer peripheral side surface of the first wiring structure layer, that is, inside an outer edge of the upper surface of the first wiring structure layer. Additionally, the outer peripheral side surface of the second wiring structure layer may be inclined inward and thus tapered.

Preferably, the first wiring structure layer includes a first connection portion on the upper surface side thereof which is connected to the second wiring. The second wiring structure layer includes a second connection portion on the upper surface side thereof which is electrically continuous with the first connection portion and which is connected to the fanout wiring. The second connection portion is relocated closer to an outer edge side of the semiconductor element than a position of the first connection portion.

The wiring board according to the exemplary embodiment includes a protective insulating film covering the upper surface-side wiring, an opening included in the protective insulating film, and an external terminal formed of a portion of the upper surface-side wiring which is exposed in the opening or formed of a conductive portion provided in the opening.

The wiring board according to the exemplary embodiment may include a third wiring structure layer including a third wiring and a third insulating layer alternately provided on the wiring board. The third wiring structure layer includes the fanout wiring serving at least as a lowermost layer-side third wiring. The fanout wiring may be electrically connected to the upper layer-side third wiring.

The third insulating layer may be formed of a resin material different from the resin material of the second insulating layer. The third insulating layer may contain a filler. On the other hand, the second insulating layer preferably contains no filler.

The third wiring is thicker than the second wiring, and the third insulating layer is thicker than the second insulating layer. The third wiring preferably is at least twice as thick as the second wiring. The third insulating layer preferably is at least twice as thick as the second insulating layer. Moreover, preferably, the third layer is at least twice as thick as the second wiring, and the third insulating layer is at least twice as thick as the second insulating layer.

If the wiring board according to the exemplary embodiment includes the third wiring structure layer, the wiring board includes an insulating layer with an opening on an uppermost layer side thereof. The wiring board may include an external terminal formed of a portion of the upper surface-side wiring which is exposed in the opening or formed of a conductive portion provided in the opening.

The wiring board according to the exemplary embodiment may include a fourth wiring structure layer including a fourth insulating layer and a fourth wiring alternately provided on the lower surface side of the wiring board. The fourth wiring structure layer includes the lower surface-side wiring as an uppermost layer-side fourth wiring.

If the wiring board according to the exemplary embodiment includes the fourth wiring structure layer, the wiring board includes an insulating layer with an opening on a lowermost layer side thereof. The wiring board may include an external terminal formed of a portion of the fourth wiring which is exposed in the opening or formed of a conductive portion provided in the opening.

The wiring board according to the exemplary embodiment includes a protective insulating film covering the lower surface-side wiring, an opening included in the protective insulating film, and an external terminal formed of a portion of the lower surface-side wiring which is exposed in the opening or formed of a conductive portion provided in the opening.

The peripheral insulating layer may be formed of a resin material. The resin material may contain a filler or a reinforcement material formed of a woven or nonwoven cloth.

In the wiring board according to the exemplary embodiment, the peripheral insulating layer may cover the outer peripheral side surface of the mounted semiconductor element without covering the upper surface of the semiconductor element. The fanout wiring may be provided so as to extend from terminals on the upper surface of the semiconductor element onto the peripheral insulating layer. Alternatively, the peripheral insulating layer may cover the upper surface and outer peripheral side surface of the mounted semiconductor element, and the fanout wiring may be provided so as to extend from an area on the peripheral insulating layer which is immediately above the semiconductor element to an area on the peripheral insulating layer which is outside the outer edge of the semiconductor element.

In the wiring board according to the exemplary embodiment, a circuit pattern may be provided on a lower surface side of the semiconductor element via an adhesive layer. In this case, when the adhesive layer is formed of an insulating layer and the circuit pattern is at a ground potential, a noise shielding effect can be exerted. Furthermore, when the adhesive layer is formed of a conductive layer and the circuit pattern is at a power supply potential of the semiconductor element, operation of the semiconductor element is effectively stabilized.

The mounted semiconductor element may include a fifth wiring structure layer provided on a lower surface side of the semiconductor substrate and including a fifth wiring and a fifth insulating layer. The fifth wiring and the fifth insulating layer may be alternately provided so as to form a multilayer structure. The fifth wiring may be electrically connected to the fourth wiring. The semiconductor element may include an intra-element via penetrating the semiconductor substrate, and the first wiring and the fifth wiring may be electrically connected together via the intra-element via.

In the description of the present invention, a comparison of the thickness of the wiring and a comparison of the thickness of the insulating layer between an upper layer-side wiring structure layer and a lower layer-side wiring structure layer respectively correspond to comparisons of the minimum thicknesses of the wiring and insulating layer of the upper layer-side wiring structure layer with the maximum thicknesses of the wiring and insulating layer of the lower layer-side wiring structure layer. For example, "the second wiring is thicker than the first wiring" means that the minimum thickness of the second wiring is larger than the maximum thickness of the first wiring. "The second wiring is at least twice as thick as the first wiring" means that the minimum thickness of the second wiring is at least twice as large as the maximum thickness of the first wiring.

According to the exemplary embodiment, the thickness of the first wiring may be set to 0.08 µm or more and 1.6 µm or less and preferably to 0.1 µm or more and 1.2 µm or less. In this case, the thickness of the second wiring is preferably set to 3 µm or more and 12 µm or less and more preferably 5 µm or more and 10 µm or less. The thickness of the third wiring is preferably set larger than the set thickness of the second wiring.

The thickness of the insulating layers may be set according to the thickness of the wiring layers as necessary. However, the thickness of the first insulating layer (in FIG. 2B, a length from a lower surface of a wiring containing layer 212 to an upper surface of an interlayer insulating film 211; the length is perpendicular to the substrate) may be set to 0.09 µm or more and 3.0 µm or less and preferably 0.1 µm or more and 2.0 µm or less. The thickness of the second insulting layer may be set to 3 µm or more, preferably 4 µm or more and 30 µm or less, and more preferably 7 µm or more and 20 µm or less. The thickness of the third insulating layer is preferably set larger than the set thickness of the second insulating layer.

In the description of the present invention, the thickness of the insulating layers alternated with the wiring layers in each wiring structure layer corresponds to a length along a thickness direction (perpendicular to the substrate plane) from the upper surface of the insulating layer contacting the lower surface of the lower layer-side wiring to the upper surface of the other insulating layer contacting the lower surface of the upper layer-side wiring.

The exemplary embodiment can integrate a power supply wiring and a ground wiring into the second wiring structure layer provided on the fine, first wiring structure of the semiconductor element, thus enabling a reduction in the number or terminals. The reduced number of terminals enables an increase in the size and pitch of the terminals, thus allowing packaging capability and connection reliability to be improved. Furthermore, the fanout wiring led out from the semiconductor element to a peripheral area allows wiring structures and terminals to be formed at a pitch sufficiently larger than the pitch in the semiconductor element. The exemplary embodiment can thus reduce the number of terminals, while increasing the wiring pitch and the terminal pitch. Thus, a semiconductor element with an increased density can be built in the wiring substrate, and the connection reliability can be improved. Additionally, more signal lines can be led out, allowing a more sophisticated semiconductor element to be built in the wiring substrate.

According to the exemplary embodiment, the presence of the second wiring structure layer between the upper surface-side wiring (or the third wiring structure layer) and the first wiring structure layer allows stress mainly induced by thermal deformation to be relaxed. Thus, disconnections can be suppressed.

There is a problem that, during manufacture or use, stress occurs at the connection portion between the semiconductor element and the wiring substrate (for example, the connection portions between the vias and the terminal pads), and the connection portion is likely to be broken. This results from a great difference in the coefficient of thermal expansion between the insulating material (inorganic material or low dielectric constant material) of the semiconductor element and the insulating material (resin material) forming the wiring substrate that accommodates the semiconductor element (or a member provided on the wiring substrate). This problem is attributed to the inferior mechanical characteristics of the insulating material of the semiconductor element, and is more serious when the low dielectric constant material (Low-k material) is used. The second insulating layer of the second wiring structure layer according to the exemplary embodiment is formed of the resin material with more excellent mechanical characteristics, particularly higher breaking strength and breaking elongation rate, which are mechanical strength, than the first insulating layer. The second wiring structure layer can serve to relax the stress. In order to obtain a sufficient stress relaxation effect, the second wiring structure layer preferably includes, as the second insulating layer, an insulating layer with a modulus of elasticity smaller than the modulus of elasticity of the first insulating layer. In the case that the third wiring structure layer is formed, the second wiring structure layer preferably includes an insulating layer with a modulus of elasticity larger than the modulus of elasticity of the third wiring structure layer. The comparison of the modulus of elasticity between the insulating layers is based on 25° C. The material of the second insulating layer and the third insulating layer may have a modulus of elasticity of, for example, 0.15 GPa to 8 GPa at 25° C. The material of the first insulating layer may have a modulus of elasticity of, for example, 4 GPa or more at 25° C. The low-k material may preferably have a modulus of elasticity of 4 GPa to 10 GPa at 25° C.

In the description of the present invention, the film strength and elongation at breakage of the insulating layer corresponds to measured values in tensile tests on the insulating material in compliance with JIS K7161 (tensile characteristic tests). The modulus of elasticity corresponds to a value calculated from the strength at a strain of 0.1% based on the results of the tensile tests. The coefficient of thermal expansion corresponds to a value measured using a TMA method in compliance with JIS C 6481.

The second wiring is formed in accordance with a design rule for an intermediate size between the first wiring, which is fine, and the upper surface-side wiring (or the third wiring), which is larger. The second wiring structure layer including such a second wiring serves to appropriately suppress stress concentration caused by a sharp difference in size at the connection portions if the second wiring structure layer is not provided. Additionally, the second wiring structure layer may have a combination of a wiring thickness and an insulating thickness which enables stress to be sufficiently dealt with and ensure a contact area for the via portion which enables the stress concentrated at the connection portion to be sufficiently dealt with. This provides connection strength that allows the appropriate connection state to be maintained even when stress is generated. In addition, the second wiring structure layer allows sufficient signal lines to be led out from the first wiring structure layer as described above.

The minimum design rules (L/S) for the wirings in the first wiring structure layer, the second wiring structure layer, the third wiring structure layer (or the upper surface-side wiring), and the fourth wiring structure layer (or the lower surface-side wiring) are desirably set as follows (L denotes the wiring width, and S denotes the wiring interval).

The minimum design rule for the wiring in the first wiring structure layer is preferably such that L/S=0.01 µm/0.01 µm, that is, the first wiring preferably has a minimum wiring width of 0.01 µm or more and a minimum wiring interval of 0.01 µm or more.

The minimum design rule for the wiring in the second wiring structure layer is preferably such that L/S=2 µm/2 µm, that is, the second wiring preferably has a minimum wiring width of at least 2 µm and a minimum wiring interval of at least 2 µm.

The minimum design rule for the wiring in the third wiring structure layer (or the upper surface-side wiring) is preferably such that L/S=5 µm/5 µm, that is, the third wiring (or the upper surface-side wiring) preferably has a minimum wiring width of 5 µm or more and a minimum wiring interval of at 5 µm or more.

The minimum design rule for the wiring in the fourth wiring structure layer (or the lower surface-side wiring) is preferably such that L/S=5 µm/5 µm, that is, the fourth wiring (or the lower surface-side wiring) preferably has a minimum wiring width of 5 µm or more and a minimum wiring interval of 5 µm or more.

In view of stabilization of manufacturing yield, the following design rules are preferably set.

The minimum design rule for the wiring in the first wiring structure layer is preferably such that L/S=0.02 µm/0.02 µm, that is, the first wiring preferably has a minimum wiring width of 0.02 µm or more and a minimum wiring interval of 0.02 µm or more.

The minimum design rule for the wiring in the second wiring structure layer is preferably such that L/S=5 µm/5 µm, that is, the second wiring preferably has a minimum wiring width of 5 µm or more and a minimum wiring interval of 5 µm or more.

The minimum design rule for the wiring in the third wiring structure layer (or the upper surface-side wiring) is preferably such that L/S=20 µm/20 µm, that is, the third wiring (or the upper surface-side wiring) preferably has a minimum wiring width of 20 µm or more and a minimum wiring interval of 20 µm or more.

The minimum design rule for the wiring in the fourth wiring structure layer (or the lower surface-side wiring) is preferably such that L/S=20 µm/20 µm, that is, the fourth wiring (or the lower surface-side wiring) preferably has a minimum wiring width of 20 µm or more and a minimum wiring interval of 20 µm or more.

Figure 8A:
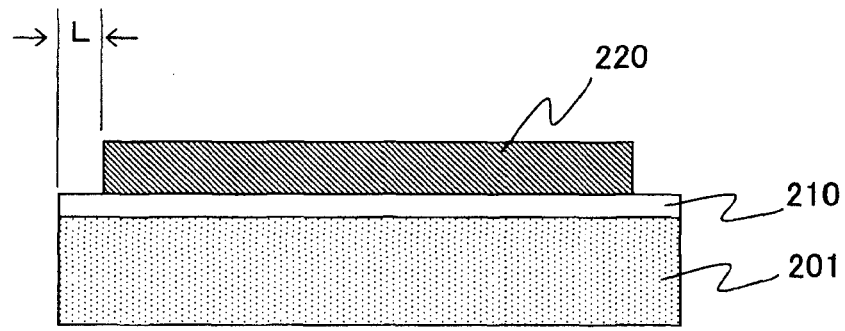
FIG. 8A is a cross-sectional view illustrating an example of the structure of an outer edge portion of a semiconductor element that is built in a wiring board according to an exemplary embodiment of the present invention.
Figure 8B:
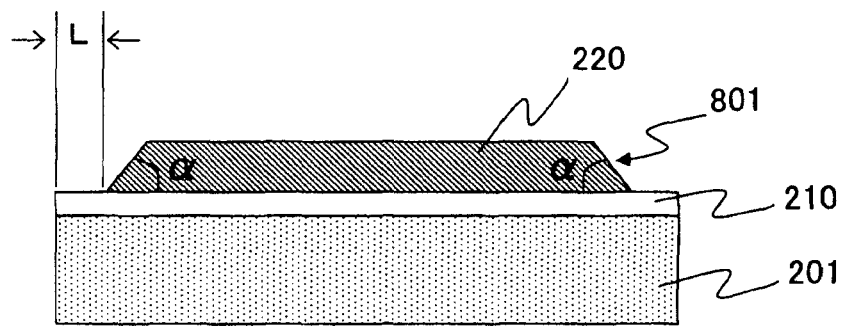
FIG. 8B is a cross-sectional view illustrating another example of the structure of an outer edge portion of a semiconductor element that is built in a wiring board according to an exemplary embodiment of the present invention.
Figure 8C:
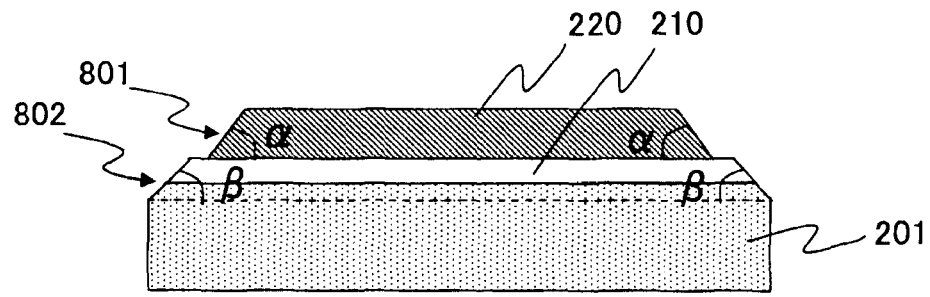
FIG. 8C is a cross-sectional view illustrating yet another example of the structure of an outer edge portion of a semiconductor element built in a wiring board according to an exemplary embodiment of the present invention.

FIG. 8A, FIG. 8B, and FIG. 8C each show an example of the structure of a semiconductor element built in a wiring board.

As shown in FIG. 8A, an outer peripheral side surface of a second wiring structure layer 220 is preferably located inside the outer edge of an upper surface of a first wiring structure layer 210 (the upper surface of an uppermost layer-side first insulating layer). This arrangement enables effective suppression of peel-off at an edge portion of the semiconductor element which is caused by stress from a side surface side (stress in a direction parallel to a substrate plane). The arrangement also allows the stress applied to the edge portion of the semiconductor element to be distributed to suppress damage to the semiconductor element. In particular, the uppermost layer-side first insulating layer in the first wiring structure layer is formed of an inorganic insulating material, a lowermost layer-side second insulating layer in the second wiring structure layer is formed of a resin material, and the insulating layer formed of the inorganic insulating material is in contact with the insulating layer formed of the resin material, the interface between such heterogeneous materials can be effectively restrained from peeling off. Such an effect can be exerted even by a wiring board of a single-sided wiring structure in which the lower surface-side wiring and the fourth wiring structure layer are not provided. Furthermore, the effects of a tapered shape described below can be exerted by the single-sided wiring structure.

Thus, the outer edge of a lower surface of the second wiring structure layer (the lower surface of a lowermost layer-side second insulating layer) is preferably located 5 µm or more and more preferably 15 µm or more inward of the outer edge of the upper surface of the first wiring structure layer in the vertical direction. That is, L in FIG. 8A and FIG. 8B is preferably 5 µm or more and more preferably 15 µm or more. For a sufficient area for the second wiring structure layer, the outer edge of the lower surface of the second wiring structure layer is located 100 µm or less and more preferably 70 µm or less inward of the outer edge of the upper surface of the first wiring structure layer. That is, L in FIG. 8A and FIG. 8B is preferably 100 µm or less and more preferably 70 µm or less.

As shown in FIG. 8B, the outer peripheral side surface of the second wiring structure layer 220 is preferably inclined inward into a tapered shape (inclined side surface 801). Thus, stress from the side surface side can be more effectively relaxed, allowing a higher damage prevention effect to be achieved. The tapered shape is such that the outer peripheral side surface of the second wiring structure layer has an inclination angle α of less than 90 degrees to the substrate plane (which, in this case, corresponds to the upper surface of the first wiring structure layer), wherein the outer edge of the upper surface of the second wiring structure layer (the upper surface of the uppermost layer-side second insulating layer) is located inside the outer edge of the lower surface of the second wiring structure layer (when both outer edges are projected on the substrate plane).

As shown in FIG. 8C, an upper surface-side edge portion of the semiconductor substrate 201 may be provided with an inwardly inclined surface, and the outer peripheral side surface of the first wiring structure layer 210 is inclined inward into a tapered shape (inclined surface 802). A single inclined surface 802 is formed by the inclined surface of the upper surface-side edge portion of the semiconductor substrate and the inclined outer peripheral side surface of the first wiring structure layer. Such a tapered shape allows the stress from the side surface side to be more effectively relaxed, producing a higher damage prevention effect. This tapered shape is such that the inclined surface 802 has an inclination angle β of less than 90 degrees to the substrate plane (which is parallel to the upper surface of the semiconductor substrate), wherein the outer edge of the upper surface of the first wiring structure layer is located inside the outer edge of the lower surface of the first wiring structure layer (the outer edge of the lower surface of the lowermost layer-side first insulating layer) (when both outer edges are projected on the substrate plane). Furthermore, the outer edge of the upper surface of the semiconductor substrate is located inside the outer edge of the lower surface of the semiconductor substrate (when both outer edges are projected on the substrate plane). The inclination angles α and β each correspond to the angle between two lines in a cross section perpendicular to the two planes. The inclination angle is preferably set to 80 degrees or less and more preferably 70 degrees or less in order to exert more sufficient stress relaxation effect and is preferably set to 30 degrees or more and more preferably 40 degrees or more in order to ensure a sufficient wiring area. Additionally, in view of processing accuracy, the inclination angle is preferably set to within such a range.

The structure of the outer edge portion of such a semiconductor element can be formed as described below utilizing differences in etchability and processability between the insulating material of the first wiring structure layer and the insulating material of the second wiring structure layer. The second wiring structure layer is processed along a scribe line (portion for dicing) on a wafer including the first wiring structure layer and the second wiring structure layer to form a trench, and thereby the first wiring structure layer is exposed in the trench. Thereafter, dicing is carried out along the scribe line positioned in the trench. The dicing forms the outer edge of the first wiring structure layer of the semiconductor element (chip). An inner side surface of the trench formed in the second wiring structure layer of the wafer forms the outer edge of the second wiring structure layer of the semiconductor element. The trench in the second wiring structure layer of the wafer may be formed using a photolithography method if the insulating material of the second wiring structure layer is a photosensitive resin. If the insulating material of the second wiring structure layer is a non-photosensitive resin, the trench may be formed by laser processing or machining. The trench is also formed by forming a mask made of processing metal or resin on the second wiring structure layer, and wet etching, dry etching, or blasting.

The tapered shape of the outer edge portion (outer peripheral side surface) of the second wiring structure layer of the semiconductor element (chip) may be formed, for example, by the following method.

If the insulating material of the second wiring structure layer is a thermosetting resin, a tapered shape may be obtained by rapidly heating the wafer, after the trench is formed in the second wiring structure layer of the wafer, to a temperature higher than a temperature range for a low elastic modulus which is exhibited before curing of the resin, so as to deform the inner side surfaces of the trench in the second wiring structure layer.

If the insulating material of the second wiring structure layer is a photosensitive resin, a tapered shape may be obtained by conducting exposure using a light blocking mask having a thin light blocking pattern (for example, a glass mask pattern with a thickness of less than 1 μm) on a portion of the mask which corresponds to the outer edge of the semiconductor element, in the step of forming the trench in the second wiring structure layer of the wafer, thereby varying the exposure amount of ultraviolet light and so on to the resin to vary the reacting amount of the resin, and then carrying out development.

If the insulating material of the second wiring structure layer is a non-photosensitive resin, a tapered shape may be obtained by carrying out, after the trench is formed in the second wiring structure layer of the wafer, blasting or dry etching on a portion of the resin which corresponds to the outer edge portion of the semiconductor element.

On the other hand, the outer edge portions of the first wiring structure layer of the semiconductor element and of the semiconductor substrate may be tapered by dry etching, laser processing, or machining with a dicing blade.

With regard to the chip size of the semiconductor element, if the planar shape of the semiconductor element is a polygon (convex polygon) such as a square or a rectangular, for processing accuracy and the like, the length of a side of the semiconductor element is preferably 0.2 mm or more, more preferably 0.5 mm or more and much more preferably 1 mm or more, and may be set to 2 mm or more. In view of size reduction, the length of a side of the semiconductor element is preferably 15 mm or less and more preferably 12 mm or less. In this case, the peripheral length of the semiconductor element is preferably 0.8 mm or more, more preferably 2 mm or more and much more preferably 4 mm or more, and may be set to 8 mm or more. The peripheral length is preferably 60 mm or less and more preferably 50 mm or less.

The exemplary embodiment allows a wiring and terminals to be provided on the lower surface side of the wiring board, improving the degree of freedom of wiring design and enabling an increase in density. Furthermore, any other semiconductor device and electronic component may be connected to both the upper and lower surface sides, allowing a high-density system to be provided. Moreover, if the upper surface-side wiring and the lower surface-side wiring are electrically connected together, semiconductor elements or electronic components provided on the upper surface side and the lower surface side can be connected together at a short distance. This allows device performance to be improved.

When an insulating material containing no filler is used for the second wiring structure layer of the built-in semiconductor element, a fine and reliable wiring structure may be easily formed which corresponds to the micro-pitch of the first wiring structure layer. Furthermore, as a result, the pitch which is to be increased in the first wiring structure layer can be reduced, enabling a reduction in the number of layers in the first wiring structure layer. Additionally, for the second wiring structure layer, wiring capacity is improved to enable a reduction in the number of layers. Therefore, the manufacturing cost can be reduced.

The third wiring structure layer and the fourth wiring structure layer may be formed using a normal buildup material for printed circuit boards and thus inexpensively manufactured. Furthermore, a resin material containing a filler may be used as a material for the insulating layer. This enables an increase in the heat resistance and mechanical strength of the insulating layer and a reduction in a difference in thermal expansion from the semiconductor element, allowing possible warpage to be suppressed. Additionally, a resin material with a relatively low film formation temperature may be used as a material for the insulating layer. Thus, process temperature can be kept low, and the possible warpage of the substrate as a whole and the degradation of materials thereof can be suppressed, improving reliability.

Exemplary embodiments will be specifically described below with reference to the drawings.

First Exemplary Embodiment

Figure 2A:
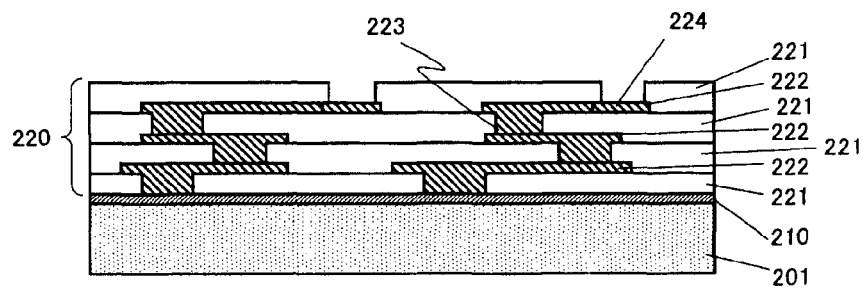
FIG. 2A is a cross-sectional view showing a semiconductor element that is mounted in the wiring board according to the first exemplary embodiment.
Figure 2B:
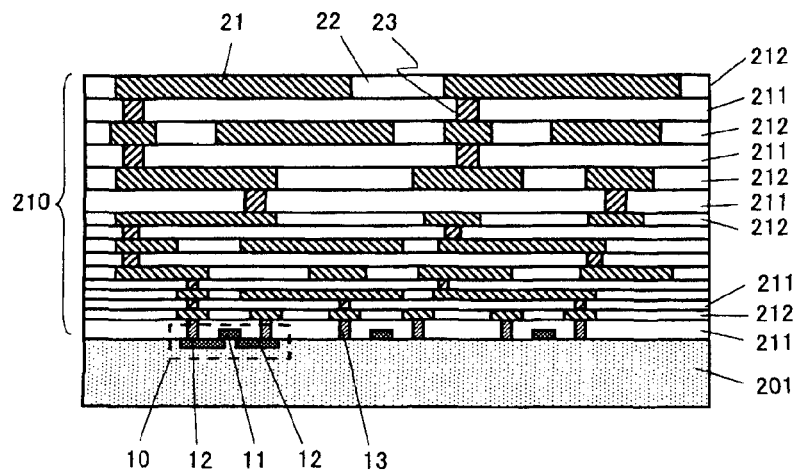
FIG. 2B is a partial cross-sectional view showing a first wiring structure layer in the semiconductor element that is mounted in the wiring board according to the first exemplary embodiment.

FIG. 1 is a cross-sectional view of a wiring board according to a first exemplary embodiment. FIG. 2A is a cross-sectional view of a semiconductor element 200 built in the wiring board. FIG. 2B is an enlarged cross-sectional view showing a first wiring structure layer 210 of the semiconductor element 200.

In the wiring board according to the first exemplary embodiment, as shown in FIG. 1, the semiconductor element (LSI chip) 200 is fixed to a base insulating layer 101 via an adhesive layer 102. The semiconductor element includes a semiconductor substrate 201, a first wiring structure layer 210 and a second wiring structure layer 220. A peripheral insulating layer 103 is provided on the base insulating layer 101 so as to cover side surfaces and an upper surface of the semiconductor element 200. A third wiring structure layer 130 is formed on the peripheral insulating layer 103 so as to cover the semiconductor element 200. On a lower surface side of the wiring board, a fourth wiring structure layer 140 is formed on a lower surface of the base insulating layer 101 so as to cover a lower surface of the peripheral insulating layer 103 and a lower surface of the semiconductor element 200. The wiring board with the built-in semiconductor element 200 is configured as described above.

The third wiring structure layer 130 includes third wiring lines 105a, 105b, and 108, a third insulating layer 106, vias 107, and an upper surface-side protective insulating layer 109. The third wiring 105a is a fanout wiring led out from a position immediately above the semiconductor element 200 to a peripheral area outside the element. The third wiring 105b is a conductive layer arranged immediately above the semiconductor element 200. A wiring may be provided from a position immediately above the semiconductor element 200 to the peripheral area outside the element via the third wiring 105b. The upper layer-side third wiring 108 is electrically connected to the lower layer-side third wiring 105a or 105b via vias 107. Exposed portions in openings in the upper surface-side protective insulating layer 109 are utilized as external terminals. A conductive material may be provided in each of the openings to form a bump. The upper surface-side protective insulating layer 109 may be formed using solder resist.

The lowermost layer-side third wiring of the third wiring structure layer 130 include the fanout wiring 105a led out from a position immediately above the semiconductor element to the peripheral area outside the outer edge of the semiconductor element, a peripheral wiring (not shown in the drawings) extending from or connected to the fanout wiring, and the conductive layers 105b arranged immediately above the semiconductor element. The fanout wiring is connected to a second wiring in the second wiring structure layer 220 via a via 104 penetrating an insulating layer located immediately above the semiconductor element (in the present example, a peripheral insulating layer) and a terminal on the upper surface of the semiconductor element to which the via is connected. An extension portion of the fanout wiring to the peripheral area, and the peripheral wiring are connected to vias, and they are electrically connected to the upper layer-side third wiring through the vias. The vias are not limited to those which are connected to the extension portion of the fanout wiring and the peripheral wiring but may be provided in an area immediately above the semiconductor element. Thus, the wiring structures and the external terminals can be formed at a pitch sufficiently larger than the pitch in the semiconductor element.

In the present example, the third wiring of the third wiring structure layer 130 includes two wiring layers. However, the third wiring structure layer may include more layers by alternately providing more insulating layers and more wiring layers. Alternatively, the upper layer-side third wiring 108 may be omitted so that the third wiring structure layer includes one layer including the lower layer-side third wiring lines 105a and 105b (upper surface-side wiring). The upper layer-side protective insulating layer 109 may be provided on the wiring layer so that portions of the wiring layer which are exposed in the openings in the upper layer-side protective insulating layer may be utilized as external terminals. Alternatively, a conductive material may be provided in the openings to form bumps. Furthermore, in the present example, the lowermost layer-side third wiring (105a, 105b) is led out from the position immediately above the semiconductor element 200 to the peripheral area outside the element. However, the upper layer-side third wiring may be led out from the position immediately above the semiconductor element to the peripheral area outside the element.

Furthermore, in the present example, the peripheral insulating layer 103 is provided so as to cover the upper surface of the semiconductor element 200. However, the peripheral insulating layer 103 may be omitted from the area immediately above the semiconductor element 200 and cover only the periphery of the side surfaces of the semiconductor element. In this structure, the second wiring in the second wiring structure layer 220 can be connected to the third wiring lines 105a and 105b without passing through the vias 104. This structure has the advantage of allowing the second wiring structure layer 220 and the third wiring structure layer 130 to be connected together at a small pitch.

As shown in FIG. 1, the fourth wiring structure layer 140 in the present example includes one layer of fourth wiring 143 located on a lower surface of the base insulating layer 101 and a lower surface-side protective insulating layer 144 covering the fourth wiring. Portions of the fourth wiring which are exposed in openings in the lower layer-side protective insulating layer may be utilized as external terminals. A conductive material may be provided in the openings to form bumps. The lower surface-side protective insulating layer may be formed using solder resist. In the present example, the fourth wiring forms a single layer. However, a multilayer structure may be formed by alternately providing more insulating layers (fourth insulating layers) and more wiring layers (fourth wiring). The fourth insulating layers and the fourth wiring may be formed using materials and methods similar to the materials and methods for the third insulating layers and the third wiring, respectively. Forming the fourth wiring structure layer allows the lower surface side of the wiring board to be utilized, enabling dense packaging to be achieved by utilizing a back surface-side area of the semiconductor element. Furthermore, possible warpage can be effectively suppressed by making the fourth and third wiring structure layers similar in structure, for example, in the numbers of wiring layers and insulating layers stacked and material types thereof.

Furthermore, in the present example, one semiconductor element is built in one wiring board. However, a plurality of semiconductor elements may be built in the wiring board.

As shown in FIG. 2A, the semiconductor element 200 built in the wiring board according to the first exemplary embodiment includes the semiconductor substrate 201, the first wiring structure layer 210 on the semiconductor substrate, and the second wiring structure layer 220 on the first wiring structure layer.

The semiconductor substrate 201 of the semiconductor element is ground before fixation so as to have a predetermined thickness, and an adhesive layer 102 is provided on a ground surface.

The semiconductor substrate 201 may be formed of, for example, silicon, germanium, gallium arsenide (GaAs), gallium arsenide phosphate, gallium nitride (GaN), silicon carbide (SiC), zinc oxide (ZnO), any other compound semiconductor (a group II-VI compound, a group III-V compound, or a group VI compound), or diamond. However, the first exemplary embodiment is not limited to this semiconductor substrate. An LSI chip using a silicon substrate may be preferably used as the semiconductor element according to the first exemplary embodiment. The thickness of the semiconductor substrate 101 may be set to, for example, 50 μm, and the size of the chip may be set to, for example, 10 mm square.

The adhesive layer 102 is not particularly limited provided that the adhesive layer 102 can be fixed on the base insulating layer 101 at a desired strength. The adhesive layer 102 may be, for example, a semicured resin referred to as a die attachment film (DAF), a resin paste made of an epoxy resin, a polyimide resin, BCB (Benzocyclobutene), PBO (Polybenzoxazole) and so on, or a silver paste.

As shown in FIG. 2A, the second wiring structure layer 220 includes second insulating layers 221, second wiring layers 222, and second vias 223. The second insulating layers 221 and second wiring layers 222 are alternately stacked. In this stacked structure, an upper layer-side second wiring layer and a lower layer-side second wiring layer are connected together via second vias penetrating the second insulating layer between them. The lowermost layer-side second wiring is connected to a conductive portion on a surface of the first wiring structure layer 210 via second vias penetrating the lowermost layer-side second insulating layer (the second insulating layer on the first wiring structure layer 210). As shown in FIG. 2A, the lowermost layer portion of the second wiring structure layer 220 includes the insulating layer 221 provided on the first wiring structure layer 210, the wiring 222 provided on the insulating layer 221, and the vias 223 connecting the wiring 222 to a conductive portion (not shown in the drawings) on an upper surface of the first wiring structure layer. However, the wiring may be formed directly on the first wiring structure layer so as to be connected directly to the conductive portion (not shown in the drawings) on the upper surface of the first wiring structure layer 210. Furthermore, the first exemplary embodiment is not limited to the number of layers shown in FIG. 2A. The structure may include at least one wiring layer, or at least one wiring layer and insulating layers that are alternately stacked, and the number of the layers may be equal to or greater than the number shown in FIG. 2A.

The terminals 224 formed of the uppermost layer-side wiring are provided on an upper surface of the second wiring structure layer 220. The terminals 224 are formed of portions of the wiring which are exposed in the openings in the uppermost layer-side insulating layer. A conductive material may be filled into the openings to form terminals.

As shown in FIG. 2B, the first wiring structure layer 210 is provided on the semiconductor substrate 201 with functional elements 10 formed thereon. As the functional elements 10, MOS transistors may be provided. Each of the MOS transistors includes a gate electrode 11 provided on the semiconductor substrate via a gate insulating film (not shown in the drawing) and a source/drain area 12 formed on the respective opposite sides of the gate electrode 11.

An interlayer insulating film (first insulating layer) 211 is provided on the semiconductor substrate 201 so as to cover the functional elements 10, a wiring containing layer 212 is provided on the interlayer insulating film 211, and interlayer insulating films 211 and wiring containing layers 212 are alternately stacked. The wiring containing layer 212 includes a wiring line 21 (first wiring) and an inter-wiring insulating layer 22 filled between the wiring lines 21. The lowermost layer-side wiring line 21 is electrically connected to the source/drain area 12 or the gate electrode via a corresponding contact plug 13 formed in the lowermost layer-side interlayer insulating film 211. The upper layer-side wiring line 21 and the lower layer-side wiring line 21 are electrically connected together via vias 23 formed in the interlayer insulating film 211 between the wiring lines 21. Furthermore, FIG. 2B shows, as an example, a case where planar MOS transistors are provided. However, vertical transistors or FinFETs with three-dimensional structures or transistors formed of an organic material may be provided.

The first wiring structure layer 210 and the functional elements 10 may be formed by a normal semiconductor manufacturing process technique.

Examples of a wiring material for the first wiring structure layer 210 include copper and aluminum. The wiring in the first wiring structure layer may be formed by, for example, a damascene method. For example, wiring may be formed by the damascene method as follows. First, an insulating layer is formed, and trenches shaped like desired wiring patterns and via patterns are formed in the insulating film using a lithography technique and a dry etching technique. Then, a barrier metal layer is formed, by a sputtering method, a CVD (Chemical Vapor Deposition) method, an ALD (Atomic Layer Deposition) method, or the like, all over the surface of the insulating film including the inside of the trench. An electric feeding layer for electroplating is formed by the sputtering method or the like. A copper film is formed by an electro-copper plating method so as to fill in the trench. Then, the barrier metal and the copper are polished by a CMP (Chemical Mechanical Polishing) method so as to be left only in the trench.

The thickness of the first wiring 21 may be set, for example, to be in a range of 0.08 μm to 2 μm, preferably to 0.1 μm or more, and preferably to 1.6 μm or less, and more preferably to 1.2 μm or less.

The thickness of the interlayer insulating film 211 (excluding the inter-wiring insulating film) may be set, for example, to be in a range of 0.01 μm to 2 μm, preferably to 0.03 μm or more, and preferably to 1.6 μm or less, and more preferably to 1.2 μm or less.

As a material for the insulating film in the first wiring structure layer 210, an inorganic insulating material may be preferably mainly used based on a focus on an increase in manufacturing accuracy required to deal with design rules for small wiring and on stabilization of electrical characteristics. An organic insulating material may be used for a part of the insulating film as a low dielectric constant material with a lower relative dielectric constant than $SiO_2$ (Low-k material). Examples of the organic insulating material include $SiO_2$, $Si_3N_4$, NSG (Non dope Silicate Glass), BSG (Boron Silicate Glass), PSG (Phospho Silicate Glass), and BPSG (Boron Phosphorous Silicate Glass).

To allow a reduction in the parasitic capacitance of signal wiring lines, in a plurality of the insulating films, at least one interlayer insulating film 211 or inter-wiring insulating film 22 located near the semiconductor substrate 201 is desirably formed of a Low-k material. Examples of the Low-k material include inorganic insulating films such as a porous silicon oxide film (porous silica film) and porous HSQ (Hydrogen SilisesQuioxane), organic insulating films such as porous MSQ (MethylSilsesQuioxane) and an organic polymer, and fluorine containing insulating films such as a fluorine-based polymer. Low-k materials with a modulus of elasticity in a range of 4 GPa to 10 GPa at 25° C. may be preferably used.

The second insulating layer 221 in the second wiring structure layer 220 is formed of an insulating material different from the insulating material of the first insulating layer (interlayer insulating layer 211 and inter-wiring insulating layer 22) in the first wiring structure layer 210. The thickness of the second insulating layer 221 is larger than the thickness of the first insulating layer in the first wiring structure layer (total of the thickness of the interlayer insulating layer 211 and the thickness of the inter-wiring insulating layer 22). Furthermore, the thickness of the second wiring 222 in the second wiring structure layer 220 is larger than the thickness of the first wiring 21.

The second wiring 222 in the second wiring structure layer 220 as described above can be formed utilizing what is called super-connect, a wiring technique (wafer level rewiring technique) preferable for a wiring size that is intermediate between the wiring size for a semiconductor manufacturing process and the wiring size for a printed circuit board manufacturing process.

The second wiring 222 may be formed by a subtractive method, a semi-additive method, a full additive method, or the like. The semi-additive method is preferable because the method allows smaller pitches to be dealt with.

The semi-additive method involves forming an electric feeding layer by an electroless plating method, the sputtering method, the CVD method, or the like, then forming a resist with openings in a desired pattern, depositing metal in the openings by the electro plating method, removing the resist, and then etching the electric feeding layer to obtain a desired wiring pattern.

The subtractive method involves forming a resist in a desired pattern on a copper foil provided on a substrate or an insulating layer, etching away unwanted portions of the copper film, and stripping the resist to obtain a desired pattern.

The full additive method involves allowing an electroless catalyst to be adsorbed on a substrate or an insulating layer, forming a resist in a desired pattern, activating the catalyst with the resist left as an insulating film, and depositing metal in openings in the resist insulating film by the electroless plating method to obtain a desired wiring pattern.

A material for the second wiring 222 may be a metal material containing one or more selected from the group consisting of copper, silver, gold, nickel, aluminum, titanium, molybdenum, tungsten, and palladium. In particular, copper is preferable in terms of electric resistance and costs. For example, copper of thickness 5 μm may be used to form the second wiring by the semi-additive method. An alternative method involves forming an adherence layer using a conductive material that tightly contacts the insulating layer (for example, titanium, tungsten, or an alloy of titanium and tungsten), and forming a conductive layer using another conductive material (for example, copper or aluminum) to form the second wiring with a structure with the adherence layer and the conductive layer stacked therein.

The second wiring 222 is thicker than the first wiring 21 and is preferably at least twice and more preferably at least three times as thick as the first wiring 21. Moreover, the second wiring 222 may be set at least four times as thick as the first wiring 21. The wiring resistance decreases with increasing thickness of the second wiring, and thus a plurality of power supply wiring lines and ground wiring lines on the semiconductor element may be bundled together to reduce the number of terminals. At the same time, the second wiring structure layer 220 enables a new signal wiring difficult to lead out from the semiconductor element to be easily led out from the semiconductor element 200. Excessively thick second wiring may make difficult the formation of a desired wiring structure appropriately connected to the fine, first wiring structure layer (which in particular has a small pitch) or significantly increase the thickness of the second wiring structure layer. Hence, to avoid being excessively large, the thickness of the second wiring is preferably set, for example, at most 10 times as large as the maximum thickness of the first wiring as necessary. Furthermore, the thickness of the second wiring is preferably set smaller than the minimum thickness of the third wiring (or the upper surface-side wiring). The thickness of the second wiring is set, for example, to be in a range of 3 μm to 12 μm, and more preferably to be in a range of 5 μm to 10 μm.

As a material for the second insulating layer, a resin insulating material may be preferably used. For example, a photosensitive or non-photosensitive organic material may be used. Examples of the resin insulating material include, without limitation, an epoxy resin, an epoxy acrylate resin, a urethane acrylate resin, a polyester resin, a phenol resin, a polyimide resin, BCB (BenzoCycloButene), PBO (PolyBenzOxazole), and a polynorbornene resin. For example, the second insulating layer may be formed using a polyimide resin of thickness 10 μm. In particular, polyimide resin and PBO are excellent in mechanical characteristics such as the film strength, modulus of elongation, and rupture elongation percentage, and thus achieve high reliability.

If a photosensitive material is used as the resin insulating material, via holes can be formed by the photolithography method. If the resin insulating material is a non-photosensitive material or an organic material which is photosensitive but which has a low pattern resolution, via holes can be formed by laser, dry etching, blasting, or the like.

When a resin material is used for the second insulating layer, the second insulating layer can be deformed to relax stress applied to the semiconductor element by distortion between the semiconductor element and the third wiring structure layer (or the upper surface-side wiring), enabling an effective reduction in the stress transmitted to the first wiring structure layer. The material of the second insulating layer desirably has a modulus of elasticity, for example, in a range of 0.15 GPa to 8 GPa at 25° C. An excessively low modulus of elasticity increases the deformation amount of the second insulating layer when the stress is relaxed, causing most of the stress to be applied to the second wiring. The second wiring is thus likely to be broken, or damaged at the interface between the second wiring and the via 104. An excessively high modulus of elasticity reduces the deformation amount of the second insulating layer, making the stress relaxation by the second wiring structure layer insufficient. This reduces the effect of suppressing interlayer peel-off and insulating film breakdown in the first wiring structure layer. Furthermore, with a combination of insulating materials in which the insulating film (first insulating layer) in the first wiring structure layer has a lower modulus of elasticity than the second insulating layer, the stress in the second wiring structure layer can be more effectively relaxed and the first wiring structure layer can be more effectively protected. If the third wiring structure layer is provided, the second wiring structure layer may include, as the second insulating layer, an insulating layer with a higher modulus of elasticity than the third insulating layer, and thus the stress relaxation effect of the second wiring structure layer can be achieved, with the function for electric connections in the second wiring structure layer sufficiently provided.

The thickness of the second insulating layer 221 can be set larger than the thickness of the first insulating layer (interlayer insulating layer 211 and inter-wiring insulating layer 22), and is preferably at least twice and more preferably three times as large as the thickness of the first insulating layer. Moreover, the thickness of the second insulating layer 221 can be set at least four times as large as the thickness of the first insulating layer. A thicker second insulating layer allows sufficient coatability, shock resistance and a sufficient stress relaxation effect to be achieved. An excessively thick second insulating layer makes the formation of vias difficult and increases the size in the thickness direction. Thus, preferably, the thickness of the second insulating layer is prevented from being excessively thick and is set, for example, at most 20 times as large as the maximum thickness of the first insulating layer. If the third wiring structure layer is provided, the thickness of the second insulating layer is preferably set smaller than the minimum thickness of the third insulating layer. At least the uppermost layer-side insulating layer in the second wiring structure layer is preferably at least 3 μm in thickness. The thickness of the second insulating layer can be set, for example, to be in a range of 3 μm to 30 μm and is preferably set to be in a range of 7 μm to 20 μm.

The second insulating layer 221 may be formed using, for example, a transfer molding method, a compression molding method, a printing method, a vacuum press method, a vacuum lamination method, a spin coat method, a die coat method, a curtain coat method, or the photolithography method. For example, a polyimide resin may be formed into a film by the spin coat method.

When the second wiring structure layer is formed using, as the material of the second insulating layer 221, a composite material with a resin immersed in a reinforcement material such as a woven or nonwoven cloth formed of a glass cloth, aramid fibers or the like, or a resin containing an inorganic or organic filler, the likelihood of short-circuiting between the wiring lines increases as the wiring is finer. Hence, the material of the second insulating layer preferably contains no reinforcement material or filler.

The third wiring structure layer 130 may be formed using a normal technique for manufacturing a printed circuit board. In particular, the third wiring structure layer 130 can be preferably formed using a buildup method that is applied to the formation of an interposer board.

The third wiring or the upper surface-side wiring may be formed by the subtractive method, the semi-additive method, the full additive method, or the like.

A material for the third wiring or the upper surface-side wiring may be a metal material including one or more selected from the group consisting of copper, silver, gold, nickel, aluminum, titanium, molybdenum, tungsten and palladium. In particular, copper is preferable in terms of electric resistance and costs. For example, copper of thickness about 10 μm may be used to form third wiring by the semi-additive method.

The third wiring or upper surface-side wiring is thicker than the second wiring and is preferably at least 1.5 times and more preferably at least twice as thick as the second wiring. The wiring resistance decreases with increasing wiring thickness, and thus power supply wiring lines and ground wiring lines led out from the semiconductor element can be bundled together respectively to reduce the number of external terminals. Excessively thick wiring may make difficult the formation of a desired wiring structure appropriately connected to the relatively fine, second wiring structure layer (which in particular has a relatively small pitch) or significantly increase the thickness of the third wiring structure layer. Hence, to avoid being excessively large, the thickness of the third wiring or upper surface-side wiring is preferably set, for example, at most 10 times as large as the maximum thickness of the second wiring as necessary.

As a material for the insulating layer (third insulating layer) in the third wiring structure layer 130, a resin insulating material may be preferably used. For example, a photosensitive or non-photosensitive organic material may be used. Examples of the resin insulating material include, without limitation, an epoxy resin, an epoxy acrylate resin, a urethane acrylate resin, a polyester resin, a phenol resin, a polyimide resin, BCB (BenzoCycloButene), PBO (PolyBenzOxazole), and a polynorbornene resin. Furthermore, the material of the third insulating layer may be a composite material with a resin immersed in a reinforcement material such as a woven or nonwoven cloth formed of a glass cloth, aramid fibers or the like, the above resins containing an inorganic or organic filler, or a silicon resin (silicone resin). For example, in order to allow sufficient recesses and protrusions to be formed on the surface of the third insulating layer to obtain tight contact with a third wiring of thickness 10 μm, for example, an epoxy resin containing a filler that advantageously allows recesses and protrusions to be formed may be used as the material of the third insulating layer.

The thickness of the third insulating layer is set larger than the thickness of the second insulating layer, and is preferably at least 1.5 times and more preferably at least twice as large as the thickness of the second insulating layer 109. A thicker third insulating layer allows sufficient coatability, shock resistance and a sufficient stress relaxation effect to be achieved. An excessively thick third insulating layer makes the formation of vias difficult and increases the size in the thickness direction. Thus, preferably, the thickness of the third insulating layer is prevented from being excessively thick and is set, for example, at most 10 times as large as the maximum thickness of the second insulating layer.

The third insulating layer may be set to, for example, 20 μm in thickness. That is, if the thickness of the second insulating layer is set to 10 μm, the thickness of the third insulating layer may be set twice as large as the thickness of the second insulating layer.

The third insulating layer may be formed using, for example, the transfer molding method, the compression molding method, the printing method, the vacuum press method, the vacuum lamination method, the spin coat method, the die coat method, the curtain coat method, or the photolithography method. For example, the third insulating layer may be properly formed by the vacuum lamination method using an epoxy resin containing a filler.

The base insulating layer 101 may be formed using the material and method used to form the third insulating layer.

The peripheral insulating layer 103 is preferably formed of a material which can tightly contact the side surfaces (or the side surfaces and upper surface) of the semiconductor element 200, can be easily molded at relatively low temperatures, and is unlikely to warp the device as a whole. A resin material is preferable for the peripheral insulating layer, and for example, a photosensitive or non-photosensitive organic material may be used to form the peripheral insulating layer. Examples of the resin material include an epoxy resin, an epoxy acrylate resin, a urethane acrylate resin, a polyester resin, a phenol resin, a polyimide resin, BCB (BenzoCycloButene), PBO (PolyBenzOxazole), and a polynorbornene resin. Furthermore, the material of the third insulating layer may be a composite material with a resin immersed in a reinforcement material such as a woven or nonwoven cloth formed of a glass cloth, aramid fibers or the like, the above resins containing an inorganic or organic filler, or a silicon resin (silicone resin). For example, an epoxy resin may be preferably used.

The peripheral insulating layer 103 can be formed by providing an insulating layer formed of the above-described resin material on the base insulating layer 101 (or a support substrate to be subsequently removed) by the vacuum lamination method or the vacuum press method so that the insulating layer covers the semiconductor element 200. The peripheral insulating layer may be formed of a single resin layer or a laminate of a plurality of resin layers. If the peripheral insulating layer is formed of a laminate, the peripheral insulating layer may be formed via a multistep process. If a resin layer containing a reinforcement material made of a glass cloth or aramid fibers is provided, the peripheral insulating layer may be formed using a resin layer with an opening that can accommodate the semiconductor element.

For example, the second wiring in the second wiring structure layer 220 may be connected to the lowermost layer-side third layer (or the upper surface-side wiring) in the third wiring structure layer 130 as follows.

The peripheral insulating layer 103 covering the second wiring structure layer 220 is formed. Then, openings are formed by laser or the like in the insulating layer (peripheral insulating layer) located immediately above the second wiring structure layer so as to expose terminal portions of the uppermost layer-side second wiring or terminals such as pads which are connected to the second wiring. A conductive material is filled into the openings to form vias. The third wiring (or upper surface-side wiring) may be formed so as to connect to the vias.

An alternative method involves forming bumps (also referred to as "posts") on the terminal portions of the uppermost layer-side second wiring or the thermals such as pads which are connected to the second wiring, fixing the semiconductor element with such bumps formed thereon to the base insulating layer or the support substrate, then forming the peripheral insulating layer 103, and removing portions of the insulating layer (peripheral insulating layer) which are located on the bumps to expose upper surfaces of the bumps. Then, the third wiring (or the upper surface-side wiring) may be formed so as to connect to the bumps.

Some of the terminal portions of the uppermost layer-side second wiring in the second wiring structure 220 or the terminals such as pads which are connected to the second wiring may be connected to the lowermost layer-side third wiring (or the upper surface-side wiring) in the third wiring structure layer, and others may be connected to the upper layer-side third wiring via vias.

In the wiring board according to the first exemplary embodiment, the wiring pitch may increase in the following order: the first wiring structure layer 210, the second wiring structure layer 220, and the third wiring structure layer 130. The power supply wiring lines and the ground wiring lines can be integrated in the second wiring structure layer 220, respectively. The fanout wiring led out from the second wiring structure layer 220 allows the wiring structure (third wiring structure layer) and the terminals to be formed at a pitch sufficiently larger than the pitch in the semiconductor element. As a result, the exemplary embodiment can improve the reliability and provide a wiring board (semiconductor package) with a built-in semiconductor element (for example, an LSI chip).

Furthermore, a resin insulating material with no filler may be used as the second insulating layer in the second wiring structure layer 220. This allows the very small wiring pitch of the lower layer-side wiring structure (first wiring structure layer 210) to be adequately dealt with and enables a reliable wiring structure to be formed.

Furthermore, as the third insulating layer in the third wiring structure layer 130, a material with a lower curing temperature than the material of the second insulating layer may be used. This allows possible warpage to be suppressed even when the device as a whole is made thinner.

For example, the amount of warpage can be smaller in a case where a polyimide resin containing no filler is used as the second insulating layer and where an epoxy resin containing fillers and having a low curing temperature is used as the third insulating layer than in a case where an epoxy resin is used for the lower layer side and where a polyimide resin with a high curing temperature is used for the upper layer side. This is because the process temperature can be reduced in the former case. Furthermore, in this case, the second insulating layer contains no filler and thus allows the formation of a second wiring structure layer adapted for the micro-wiring structure of the first wiring structure layer. The third insulating layer contains fillers and thus can serve to improve the heat resistance and mechanical strength of the third wiring structure layer, and accordingly those of the device as a whole can be improved.

Variation of the First Exemplary Embodiment

Figure 3A:
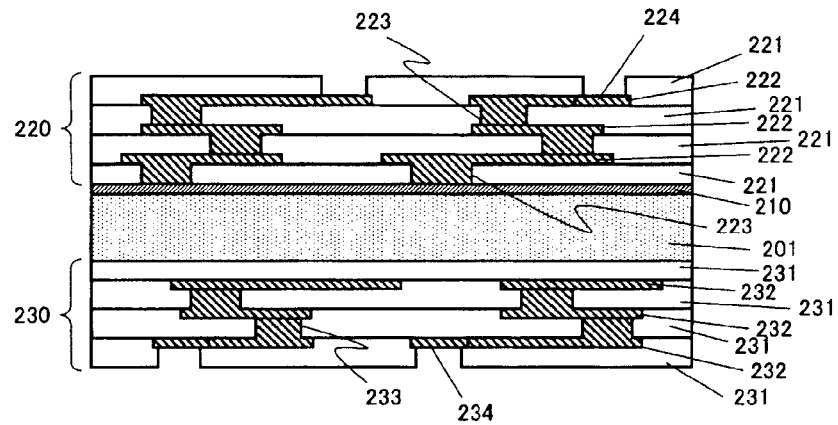
FIG. 3A is a cross-sectional view showing a semiconductor element that is mounted in a wiring board according to a variation of the first exemplary embodiment.

As a variation of the first exemplary embodiment, the present exemplary embodiment may incorporate a semiconductor element shown in FIG. 3A instead of the semiconductor element shown in FIG. 2A.

The present exemplary embodiment is similar to the first exemplary embodiment except that a wiring structure layer (hereinafter referred to as a "fifth wiring structure layer") 230 is formed on the back surface side of the semiconductor substrate 201. Like the second wiring structure layer 220, the fifth wiring structure layer 230 includes a fifth insulating layer 231, a fifth wiring 232, and vias 233, and also includes terminals 234 as necessary. A wiring pattern in the fifth wiring structure layer 230 need not be identical to the wiring pattern in the second wiring structure layer 220, and the number of layers in the fifth wiring structure layer 230 may be optionally set. However, in order to suppress possible warpage, the structure such as the numbers of wiring and insulating layers stacked, the wiring pattern and the material are preferably the same or similar between the fifth wiring structure layer 230 and the second wiring structure layer 220. The peripheral insulating layer 103 surrounds the outer peripheral side surfaces of the first wiring structure layer 210 and the second wiring structure layer 220 and also surrounds the outer peripheral side surface of the fifth wiring structure layer 230.

The fifth wiring structure layer 230 may be provided on the back surface of the semiconductor substrate 201 the thickness of which is made thinner by grinding the buck surface. The adhesive layer 102 may be provided on a lower surface of the fifth wiring structure layer 230, and thus the semiconductor element with the fifth wiring structure layer 230 can be fixed to the base insulating layer 101 (or the support substrate to be subsequently removed). Furthermore, when vias penetrating the adhesive layer 102 are formed and electrically connected to the fourth wiring, the area of the back surface of the semiconductor element can be utilized to improve the wiring capacity. Additionally, heat radiation capability and noise shielding capability can further be improved.

The semiconductor element with the above-described structure includes the insulating layers made of high toughness resin provided on the opposite surfaces of the semiconductor element. Thus the shock resistance of the semiconductor element can be improved, and further the adverse effects of the opposite insulating layers can be offset, thus suppressing possible warpage, compared to the unitary ground semiconductor element. This not only increases the size of a process window for pickup conditions for mounting (ejection speed and ejection amount), head suction conditions, mounting conditions (pressure and temperature), thus stabilizing manufacturing steps, but also improves suction capability and image recognition capability due to the flatness of the semiconductor element, thus enabling an increase in the accuracy with which the semiconductor element is mounted on the base insulating layer (or the support substrate to be subsequently removed). As a result, the possible warpage of the wiring board can be suppressed, and the manufacturing yield can be improved.

Figure 3B:
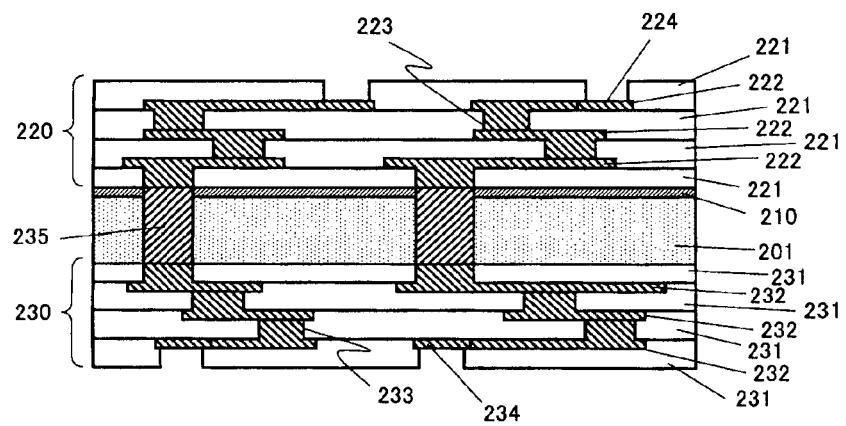
FIG. 3B is a cross-sectional view showing a semiconductor element that is mounted in a wiring board according to another variation of the first exemplary embodiment.

The semiconductor element with the fifth wiring structure layer provided on the back surface thereof allows through vias (hereinafter referred to as "intra-element through substrate vias") 235 to be formed in the semiconductor substrate 201 as shown in FIG. 3B.

The arrangement, size, and number of the intra-element through substrate vias 235 may be optionally set, and a material for the vias may be conductive or insulated. Such intra-element through substrate vias are preferably formed of copper.

Such a structure allows the intra-element through substrate vias to function as reinforcing vias or heat radiation vias. Furthermore, the semiconductor element according to the variation includes the insulating layers made of a high toughness resin provided on the opposite surfaces of the semiconductor element. Thus the shock resistance of the semiconductor element can be improved, and further the adverse effects of the opposite insulating layers can be offset, thus suppressing possible warpage, compared to the unitary ground semiconductor element. This not only increases the size of the process window for the pickup conditions for mounting (ejection speed and ejection amount), the head suction conditions, the mounting conditions (pressure and temperature), thus stabilizing the manufacturing steps, but also improves the suction capability and the image recognition capability due to the flatness of the semiconductor element, thus enabling an increase in the accuracy with which the semiconductor element is mounted on the base insulating layer (or the support substrate to be subsequently removed). As a result, the possible warpage of the wiring board can be suppressed, and the manufacturing yield can be improved. If the first wiring and the fifth wiring are electrically connected together via the intra-element through substrate vias 235, the signal wiring, the power supply wiring, and the ground wiring can be routed even on the back surface side of the semiconductor element. Therefore, a more sophisticated semiconductor element can be built in the wiring board.

Second Embodiment

Figure 4:
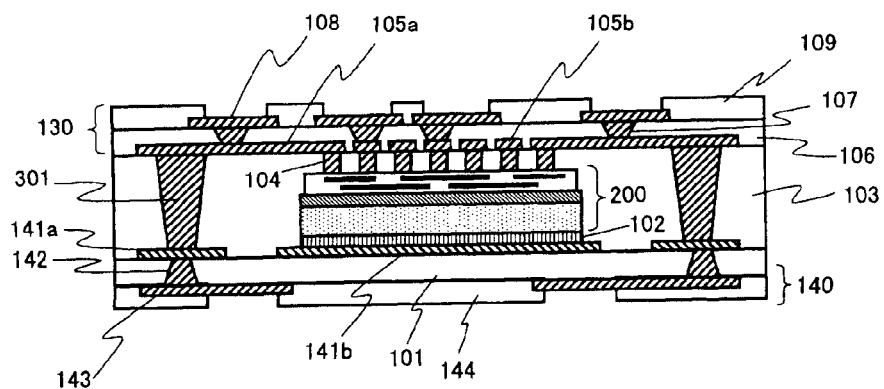
FIG. 4 is a cross-sectional view showing a wiring board according to a second exemplary embodiment of the present invention.

FIG. 4 is a cross-sectional view showing a wiring board according to a second exemplary embodiment.

According to the second exemplary embodiment, lateral-to-element vias 301 penetrating a peripheral insulating layer 103 are provided, and third wiring lines 105a are electrically connected to fourth wiring lines 143 via the lateral-to-element vias. Specifically, a lower end of each of the lateral-to-element vias 301 is connected to a corresponding connection pad 141a on a base insulating layer 101. A lower surface of the connection pad 141a connects to an upper end of a corresponding via 142 penetrating the base insulating layer 101. The lower end of the via 142 is connected to the upper surface of the corresponding fourth wiring line 143. The connection pad 141a facilitates the connection of the upper and lower vias and may be provided as necessary. Furthermore, in the present example, the lateral-to-element vias 301 penetrate the peripheral insulating layer 103. However, if the peripheral insulating layer is a laminate, the following structures are possible: a stack structure in which the vias are provided in each of the insulating layers forming the laminate and connected together, a staggered structure in which the vias in the different insulating layers are staggered with respect to one another, or a mixture of the stack structure and the staggered structure which is used if the laminate includes at least three layers. FIG. 4 illustrates the semiconductor element shown in FIG. 2A. However, the semiconductor element shown in FIG. 3A or FIG. 3B may be used.

A circuit pattern 141b may be provided on the lower surface side of the a semiconductor element 200 via the adhesive layer 102. If the circuit pattern is formed of the same material as the material of the connection pads 141a, the circuit pattern may be formed simultaneously with the formation of the connection pads. If the adhesive layer 102 is an insulating layer and the circuit pattern is at the ground potential, the noise shielding effect can be exerted. If the adhesive layer 102 is a conductive layer and the circuit pattern is at the power supply potential, the power supply potential can be effectively stabilized.

The structure in the present example including the lateral-to-element vias 301 allows a wiring or terminals electrically connected to the built-in semiconductor element to be provided even on the lower surface side of the wiring board. This improves the degree of freedom of wiring design to enable an increase in density. Furthermore, the structure allows any other semiconductor device or electronic component electrically connected to the built-in semiconductor element to be provided even on the lower surface side of the wiring board, enabling a high-density system to be configured. Moreover, the semiconductor elements or electronic components connected to the upper surface side and the lower surface side can be connected together at a short distance between them, enabling the device performance to be improved.

The above-described wiring board may include a LCR element serving as a noise filter for circuits, in any one of the wiring structure layers. A preferred material for a dielectric forming a capacitor is a metal oxide such as titanium oxide, tantalum oxide, $Al_2O_3$, $SiO_2$, $ZrO_2$, $HfO_2$, or $Nb_2O_5$; a perovskite material such as BST (($Ba_x$, $Sr_{1-x}$) $TiO_3$), PZT (Pb ($Zr_x$, $Ti_{1-x}$) $O_3$, PLZT(($Pb_{1-y}$, $La_y$) ($Zr_x$, $Ti_{1-x}$) $O_3$) ($0<x<1$, $0<y<1$); or a Bi layered compound such as $SrBi_2O_9$. Furthermore, as the material of the dielectric forming the capacitor, an organic material mixed with an inorganic material or an organic material may be used.

Furthermore, the wiring board according to the second exemplary embodiment may include a plurality of built-in semiconductor elements. The wiring board may incorporate, besides the semiconductor element, an LCR component, a MEMS component, a sensor, an energy device, or an optical component as a passive component.

A method for manufacturing the wiring board according to the present invention will be described below taking an example of manufacture.

Example of Manufacture 1

First, the semiconductor element 200 with the above-described first wiring structure layer and second wiring structure layer (and the fifth wiring structure layer as necessary) is prepared.

The semiconductor element is obtained by forming functional element such as transistors and the first wiring structure layer on a semiconductor substrate, and forming the second wiring structure layer on the first wiring structure layer. The functional elements and the first wiring structure layer may be formed by a normal technique for manufacturing a semiconductor as described above. The second wiring structure layer may be formed by utilizing the wiring technique (wafer level rewiring technique) referred to as super-connect as described above. The second wiring may be formed by, for example, the semi-additive method. The second insulating layer may include either a photosensitive material or a non-photosensitive material, and may be formed by a spin coat method, a lamination method, a press method or a printing method. Via openings may be formed by the photography method if a photosensitive resin is used, as described above. The via openings may be formed by laser processing, dry etching or blasting if a non-photosensitive material or a material which is photosensitive but which has a low pattern resolution is used. Vias may be formed by filling a conductive material into the openings thus formed. The vias may also be formed by forming, by a plating method or a printing method, metal posts in portions where the vias are to be provided, forming a second insulating layer, and then removing an upper layer portion of the second insulating layer by a dry etching method, a CMP method, a grinding method or a lapping method to expose the metal posts. A fifth wiring structure layer may be formed, as necessary, on the opposite surface of the semiconductor substrate to the surface on which the first wiring structure layer formed, as is the case with the second wiring structure layer.

A wafer may be used as a semiconductor substrate, and a plurality of element structures each corresponding to the above-described semiconductor element may be formed on the wafer. Thereafter, the wafer may be cut into the individual semiconductor elements by dicing, cutting, etching, or the like.

Figure 5:
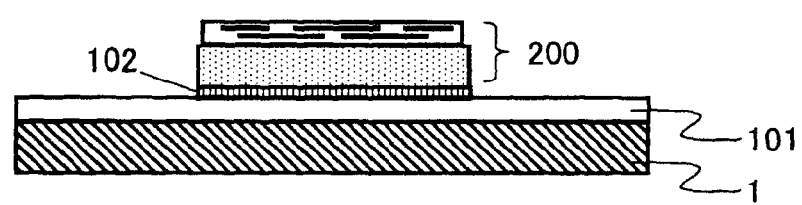
FIG. 5 is a cross-sectional view illustrating manufacturing steps in an example of manufacture of the wiring board according to the first exemplary embodiment of the present invention.
Figure 5:
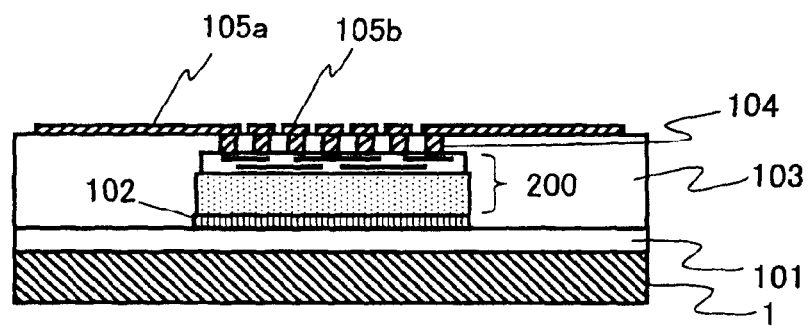
Figure 5:
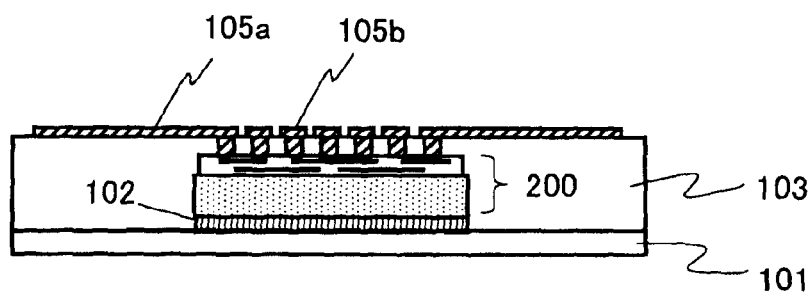

Then, as shown in FIG. 5(a), the semiconductor element 200 is fixed, via the adhesive layer 102, on the base insulating layer 101 on the support substrate 1. The semiconductor element may be fixed on the support substrate 1 via the adhesive layer without providing the base insulating layer. In this case, if the semiconductor element includes the fifth wiring structure layer, connection portions formed of a metal paste or a solder material may be provided so as to serve as vias through which the wiring in the fifth wiring structure layer are electrically connected to the wiring in the fourth wiring structure layer. The support substrate may be formed of an inorganic material, a resin material, a metal material or the like, for example, Si, glass, aluminum, stainless steel, a polyimide resin or an epoxy resin.

Then, a resin material is fed so as to cover the semiconductor element 200 and is cured to form a peripheral insulating layer 103. The vacuum lamination method or the vacuum press method is preferable as a method for feeding the resin material. If the resin material contains a reinforcement material such as a glass cloth or aramid fibers, an opening that can accommodate the semiconductor element is formed in the resin material, the resin material is placed so that the semiconductor element is located in the opening. Another resin material is further fed so as to cover the semiconductor element, and vacuum pressing is carried out to fill gaps in the opening, while integrating the resin materials together. Furthermore, if the built-in semiconductor element 200 is, for example, at least 80 μm in thickness, to form the insulating material with the opening formed therein and accommodating the semiconductor element, a cured resin material, for example, at least 20 μm in thickness may be stacked on the uncured resin material. The use of the cured resin material allows contraction of the resin material during curing to be sufficiently suppressed, restraining possible warpage. Wiring lines or vias may be provided in the cured resin material.

Then, as shown in FIG. 5(b), openings are formed, by laser or the like, in the insulating layer located immediately above the semiconductor element 200 (peripheral insulating layer) so as to expose the uppermost layer-side second wiring of the second wiring structure layer or the terminals connected to the second wiring. A conductive material is filled into the openings to form vias 104. Then, third wiring lines 105a and 105b are formed so as to connect to the vias. An insulating layer covering the third wiring may also be provided.

An alternative method includes preforming bumps on the uppermost layer-side second wiring or the terminals connected to the second wiring, fixing the semiconductor element with the bumps formed thereon to the base insulating layer, then forming a peripheral insulating layer, and removing the insulating layer (peripheral insulating layer) located immediately above the semiconductor element to expose the upper surfaces of the bumps. Thus, third wiring lines can be formed so as to connect to the bumps.

Then, as shown in FIG. 5(c), the support substrate 1 is removed. The support substrate may be removed by a method such as etching, polishing, or stripping according to the material of the support substrate. If a wiring board with a single-sided wiring structure is formed which does not include the lower surface-side wiring and the fourth wiring structure layer, the support substrate may be left without being removed in order to hold the reinforcement effect. In this case, a support substrate without the base insulating layer 101 may be used, and the wiring structure provided on the base insulating layer may be formed on the support substrate. If a sufficient strength can be ensured by the peripheral insulating layer or the like, a single-sided wiring structure with the support substrate removed may be provided.

Subsequently, an insulating layer 106, vias 107, a wiring 108 and a protective insulating layer 109 are formed on the upper surface side to complete a third wiring structure layer 130. A wiring 143 and a protective insulating layer 144 are formed on the lower surface side to complete a fourth wiring structure layer 140. As a result, the wiring board shown in FIG. 1 is obtained. If the base insulating layer 101 is not formed on the support substrate 1, the base insulating layer 101, the wiring 143 and the protective insulating layer 144 are sequentially formed to obtain the fourth wiring structure layer 140. In this case, the fourth wiring structure layer 140 may also be formed by forming the wiring 143 and the protective insulating layer 144 without forming the base insulating layer 101.

The present example uses the support substrate 1. However, a wiring board with at least a part of the fourth wiring structure layer formed therein may be used instead of the support substrate 1. Thus, a step of removing the support substrate 1 can be omitted, allowing the manufacturing steps to be simplified.

Furthermore, if the semiconductor element includes the fifth wiring structure layer, vias may be provided in one or both of the adhesive layer 102 and the base insulating layer 101. When the wiring in the fifth wiring structure layer are electrically connected to the wiring in the fourth wiring structure layer via the vias, the fifth wiring structure layer can be provided with a circuit connected to the wiring in the fourth wiring structure layer. Additionally, the vias can be allowed to function as heat radiation paths.

Example of Manufacture 2

First, the semiconductor element 200 is prepared as is the case with Example of Manufacture 1.

Figure 6:
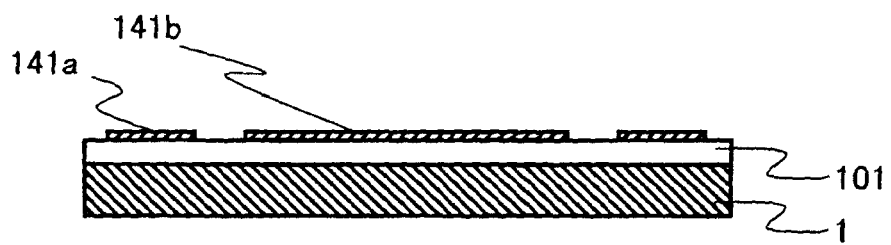
FIG. 6 is a cross-sectional view illustrating manufacturing steps in an example of manufacture of the wiring board according to the second exemplary embodiment of the present invention.
Figure 6:
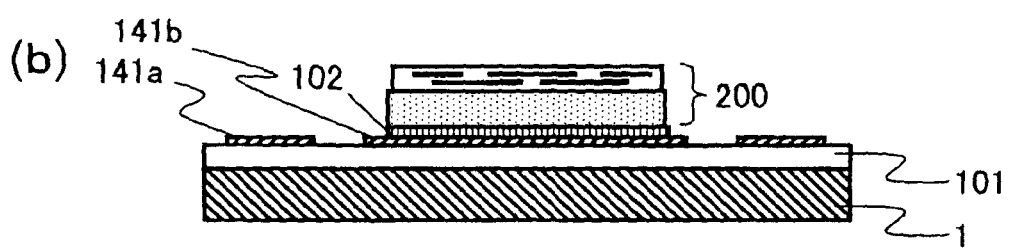
Figure 6:
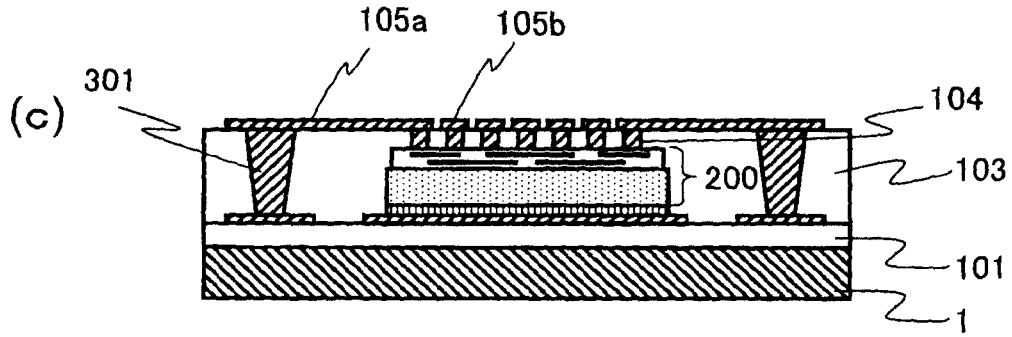
Figure 6:
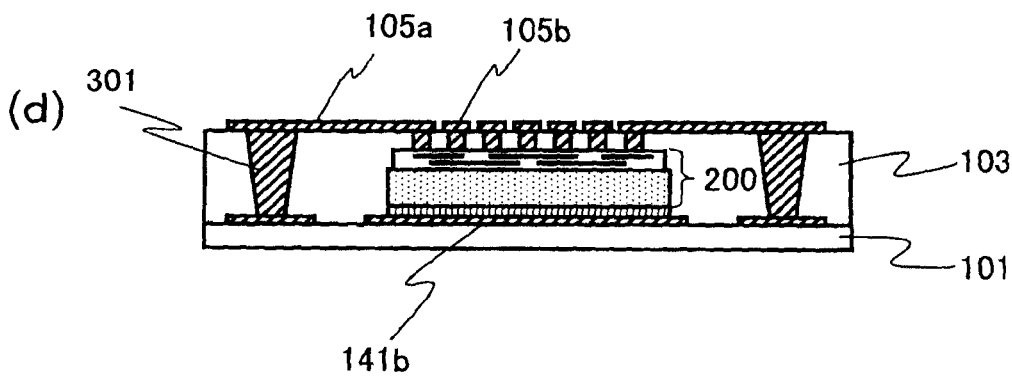

Then, as shown in FIG. 6(*a*), connection pads 141*a* and a circuit pattern 141*b* are formed on the base insulating layer 101 on the support substrate 1. The connection pads and the circuit pattern are formed by, for example, the plating method, and may be formed simultaneously or sequentially. If the subsequent removal of the support substrate is carried out by wet etching, the connection pads and the circuit pattern are formed using materials that are not dissolved into an etchant used. The connection pads and the circuit pattern may be provided as necessary, and one or both of the circuit pattern and the connection pads may be omitted.

Then, as shown in FIG. 6(*b*), the semiconductor element 200 is fixed on the circuit pattern 141*b* via the adhesive layer 102. If the circuit pattern 141*b* is not provided, the semiconductor element 200 is fixed on the base insulating layer 101 via the adhesive layer 102. At this time, if the semiconductor element includes the fifth wiring structure layer, connection portions formed of a metal paste or a solder material may be provided so as to serve as vias through which the wiring in the fifth wiring structure layer are electrically connected to the wiring in the fourth wiring structure layer.

Then, as is the case with Example of Manufacture 1, a resin material is fed so as to cover the semiconductor element 200 and is cured to form a peripheral insulating layer 103.

Then, holes that reach the connection pads 141*a* are formed in the peripheral insulating layer 103 by a laser method or the like. Resin residues in the holes are removed by a desmear process or the like as necessary. Thereafter, a conductive material is filled into the holes by the plating method or the sputtering method to form lateral-to-element vias 301 as shown in FIG. 6(*c*). Thereafter, the surface is polished to flatten it.

Then, as is the case with Example of Manufacture 1, vias 104 and third wiring lines 105*a* and 105*b* are formed as shown in FIG. 6(*c*). An insulating layer covering the third wiring lines may be provided as necessary.

Then, as is the case with Example of Manufacture 1, the support substrate 1 is removed as shown in FIG. 6(*d*).

Subsequently, an insulating layer 106, vias 107, a wiring 108, and a protective insulating layer 109 are formed on the upper surface side to complete a third wiring structure layer 130. Vias 142, a wiring 143, and a protective insulating layer 144 are formed on the lower surface side to complete a fourth wiring structure layer 140. As a result, the wiring board shown in FIG. 4 is obtained. If the base insulating layer 101, the connection pads 141*a* and the circuit pattern 141*b* are not provided on the support substrate 1, the support substrate 1 may be removed after forming lateral-to-element vias 301 penetrating the peripheral insulating layer 103 and reaching the support substrate 1. Thereafter, the following may be sequentially formed to provide a fourth wiring structure layer 140: connection pads connected to the lateral-to-element vias 301, an insulating layer 101, vias 142 penetrating the insulating layer and connected to the connection pads, a wiring 143 connected to the vias, and a protective insulating layer 144. In this case, the fourth wiring structure layer 140 may also be formed by forming a wiring 143 connected to the lateral-to-element vias 301 and a protective insulating layer 144 without forming the connection pads, the insulating layer 101 and the vias 142.

Figure 7:
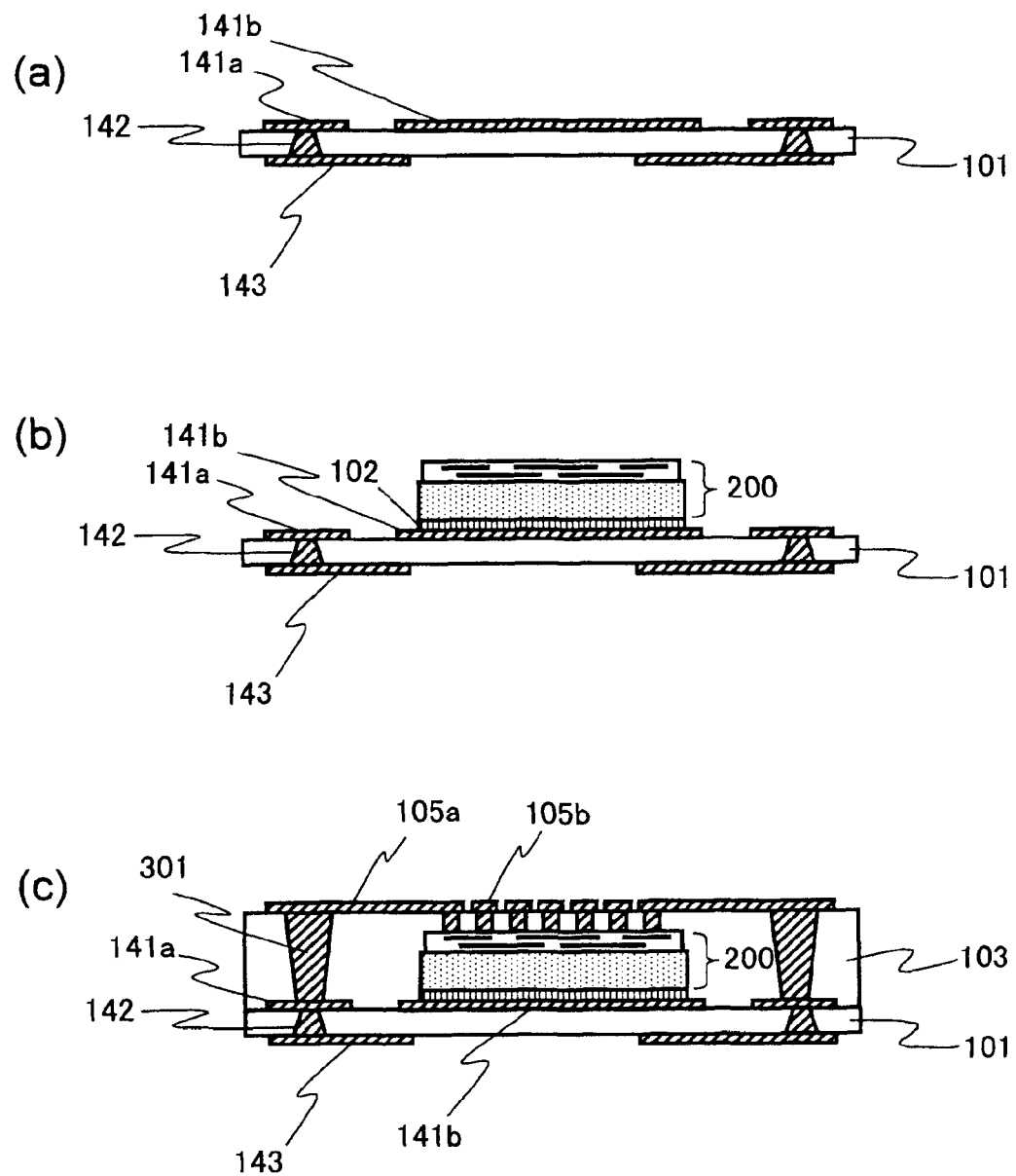
FIG. 7 is a cross-sectional view illustrating manufacturing steps in another example of manufacture of the wiring board according to the second exemplary embodiment of the present invention.

The present example uses the support substrate 1. However, a wiring board with at least a part of the fourth wiring structure layer formed therein may be used instead of the support substrate 1. Thus, a step of removing the support substrate 1 can be omitted, allowing the manufacturing steps to be simplified. For example, as shown in FIG. 7(*a*), a wiring substrate is prepared which includes connection pads 141*a* and a circuit pattern 141*b* provided on the upper surface of a base insulating layer 101, a fourth wiring 143 provided on the lower surface of the base insulating layer 101, and vias 142 penetrating the base insulating layer 101 and connecting the connection pads 141*a* and the fourth wiring 143 together. Then, as shown in FIG. 7(*b*), the semiconductor element 200 is fixed on the circuit pattern 141*b* of the wiring substrate via an adhesive layer 102. Then, as shown in FIG. 7(*c*), as is the case with the above-described example of manufacture, a peripheral insulating layer 103, lateral-to-element vias 301, vias 104 on the element, and third wiring lines 105*a* and 105*b* are formed. Subsequently, an insulating layer 106, vias 107, a wiring 108, and a protective insulating layer 109 are formed on the upper surface side to complete a third wiring structure layer 130. A protective insulating layer 144 is formed on the lower surface side to complete a fourth wiring structure layer 140. As a result, the wiring board shown in FIG. 4 is obtained.

Furthermore, if the semiconductor element includes the fifth wiring structure layer, vias may be provided in one or both of the adhesive layer 102 and the base insulating layer 101. A circuit connected to the wiring in the fourth wiring structure layer may be provided in the fifth wiring structure layer by electrically connecting the wiring in the fifth wiring structure layer to the wiring in the fourth wiring structure layer. Additionally, the vias may be allowed to function as heat radiation paths.

While the present invention has been described with reference to the exemplary embodiments, the present invention is not limited to the above embodiments. Various changes that can be understood by those skilled in the art may be made to the constitution and details of the present invention within the scope thereof.

This application claims the right of priority based on Japanese Patent Application 2010-047857 filed on Mar. 4, 2010, the entire content of which is incorporated herein by reference.

REFERENCE SIGNS LIST

1 Support substrate
10 Functional element
11 Gate electrode

12 Source/drain area
13 Contact plug
21 First wiring
22 Inter-wiring insulating layer
23 Via
101 Base insulating layer
102 Adhesive layer
103 Peripheral insulating layer
104 Via
105a Third wiring line (fanout wiring)
105b Third wiring line
106 Third insulating layer
107 Via
108 Third wiring
109 Upper surface-side protective insulating layer
130 Third wiring structure layer
140 Fourth wiring structure layer
141a Connection pad
141b Circuit pattern
142 Via
143 Fourth wiring
144 Lower surface-side protective insulating layer
200 Semiconductor element (LSI chip)
201 Semiconductor substrate
210 First wiring structure layer
211 Interlayer insulating film
212 Wiring containing layer
220 Second wiring structure layer
221 Second insulating layer
222 Second wiring
223 Via
224 Terminal
230 Fifth wiring structure layer
231 Fifth insulating layer
232 Fifth wiring
233 Via
234 Terminal
235 Intra-element through substrate via
301 Lateral-to-element via
801 Inclined surface of outer edge portion of semiconductor element (tapered shape)
802 Inclined surface of outer edge portion of semiconductor element (tapered shape)

What is claimed is:

1. A wiring board including a built-in semiconductor element, the wiring board comprising:
the semiconductor element;
a peripheral insulating layer covering at least an outer peripheral side surface of the semiconductor element;
an upper surface-side wiring provided on an upper surface side of the wiring board; and
a lower surface-side wiring provided on a lower surface side of the wiring board,
wherein the semiconductor element comprises:
a semiconductor substrate;
a first wiring structure layer including a first wiring and a first insulating layer alternately provided on the semiconductor substrate; and
a second wiring structure layer including a second wiring and a second insulating layer alternately provided on the first wiring structure layer,
the upper surface-side wiring includes a wiring electrically connected to the first wiring via the second wiring,
the second wiring is thicker than the first wiring and thinner than the upper surface-side wiring,
the second insulating layer is formed of a resin material and is thicker than the first insulating layer, and
an outer peripheral side surface of the second wiring structure layer is located inside an outer edge of an upper surface of the first wiring structure layer, the outer peripheral side surface of the second wiring structure layer including an outer peripheral side surface of a lowermost layer-side second insulating layer of the second wiring structure layer, wherein an outer edge of a lower surface of the lowermost layer-side second insulating layer is located inside the outer edge of the upper surface of the first wiring structure layer.

2. The wiring board according to claim 1, further comprising a base insulating layer, wherein the semiconductor element is provided on an upper surface side of the base insulating layer.

3. The wiring board according to claim 1, wherein the upper surface-side wiring comprises a fanout wiring led out from a position immediately above the semiconductor element to a peripheral area lying outside an outer edge of the semiconductor element, and the fanout wiring is electrically connected to the first wiring via the second wiring.

4. The wiring board according to claim 3, wherein the first wiring structure layer comprises a first connection portion on an upper surface side thereof, the first connection portion being connected to the second wiring,
the second wiring structure layer comprises a second connection portion on an upper surface side thereof, the second connection portion being electrically continuous with the first connection portion and being connected to the fanout wiring, and
the second connection portion is relocated closer to an outer edge side of the semiconductor element than a position of the first connection portion.

5. The wiring board according to claim 1, wherein the first wiring structure layer comprises an insulating layer formed of an inorganic insulating material, as the first insulating layer.

6. The wiring board according to claim 3, further comprising a lateral-to-element via electrically connected to the fanout wiring in the peripheral insulating layer,
wherein the lower surface-side wiring is electrically connected to the fanout wiring via the lateral-to-element via.

7. The wiring board according to claim 1, wherein the first wiring structure layer comprises an insulating layer formed of a low dielectric constant insulating material, as the first insulating layer.

8. The wiring board according to claim 1, wherein the second wiring structure layer comprises an insulating layer having a modulus of elasticity smaller than the first insulating layer, as the second insulating layer.

9. The wiring board according to claim 1, wherein the second wiring is at least twice as thick as the first wiring.

10. The wiring board according to claim 1, wherein the second insulating layer is at least twice as thick as the first insulating layer.

11. The wiring board according to claim 1, wherein the second wiring is formed based on a design rule different from a design rule for the first wiring, a design rule for the upper surface-side wiring and a design rule for the lower surface-side wiring, and
a minimum wiring width and a minimum wiring interval for the second wiring are respectively larger than a minimum wiring width and a minimum wiring interval for the first wiring, and smaller than a minimum wiring width and a minimum wiring interval for the upper surface-side wiring and a minimum wiring width and a minimum wiring interval for the lower surface-side wiring.

12. The wiring board according to claim 1, further comprising a protective insulating film covering the upper surface-side wiring,
wherein the protective insulating film includes an opening, and the wiring board includes an external terminal formed of an exposed portion of the upper surface-side wiring in the opening, or an external terminal formed of a conductive portion provided in the opening.

13. The wiring board according to claim 3, further comprising a third wiring structure layer including a third wiring and a third insulating layer alternately provided on the wiring board,
wherein the third wiring structure layer includes the fanout wiring at least as a lowermost layer-side third wiring, and the fanout wiring is electrically connected to an upper layer-side third wiring.

14. The wiring board according to claim 13, wherein the second insulating layer is formed of a resin material containing no filler, and
the third wiring structure layer comprises, as the third insulating layer, an insulating layer formed of a resin material containing a filler.

15. The wiring board according to claim 13, wherein the third wiring is thicker than the second wiring, and the third insulating layer is thicker than the second insulating layer.

16. The wiring board according to claim 15, wherein the third wiring is at least twice as thick as the second wiring.

17. The wiring board according to claim 15, wherein the third insulating layer is at least twice as thick as the second insulating layer.

18. The wiring board according to claim 13, wherein the second wiring structure layer comprises an insulating layer having a modulus of elasticity larger than the third insulating layer, as the second insulating layer.

19. The wiring board according to claim 13, comprising an insulating layer with an opening on an uppermost layer side, and an external terminal formed of an exposed portion of the third wiring in the opening, or an external terminal formed of a conductive portion provided in the opening.

20. The wiring board according to claim 1, further comprising a fourth wiring structure layer including a fourth insulating layer and a fourth wiring alternately provided on a lower surface side of the wiring board, and
the fourth wiring structure layer includes the lower surface-side wiring as an uppermost layer-side fourth wiring.

21. The wiring board according to claim 20, comprising an insulating layer with an opening on a lowermost layer side; and an external terminal formed of an exposed portion of the fourth wiring in the opening, or an external terminal formed of a conductive portion provided in the opening.

22. The wiring board according to claim 1, further comprising a protective insulating film covering the lower surface-side wiring,
wherein the protective insulating film includes an opening, and the wiring board includes an external terminal formed of an exposed portion of the lower surface-side wiring in the opening, or an external terminal formed of a conductive portion provided in the opening.

23. The wiring board according to claim 1, wherein a noise-shielded circuit pattern is provided on a lower surface side of the semiconductor element via an insulating adhesive material.

24. The wiring board according to claim 1, wherein a potential stabilization circuit pattern is provided on a lower surface side of the semiconductor element via a conductive adhesive material.

25. The wiring board according to claim 1, wherein the semiconductor element further comprises a fifth wiring structure layer comprising a fifth wiring and a fifth insulating layer, provided on the lower surface side of the semiconductor substrate.

26. The wiring board according to claim 5, wherein the fifth wiring is electrically connected to the fourth wiring.

27. The wiring board according to claim 1, wherein the outer edge of the lower surface of the lowermost layer-side second insulating layer is located 5 μm or more inward of the outer edge of the upper surface of the first wiring structure layer.

28. The wiring board according to claim 1, wherein the outer edge of the lower surface of the lowermost layer-side second insulating layer is located 15 μm or more inward of the outer edge of the upper surface of the first wiring structure layer.

29. The wiring board according to claim 1, wherein the outer peripheral side surface of the second wiring structure layer is inclined inward and thus tapered.

* * * * *